(12) United States Patent
Furukawa et al.

(10) Patent No.: US 10,516,350 B2
(45) Date of Patent: Dec. 24, 2019

(54) POWER GENERATOR

(71) Applicant: MITSUMI ELECTRIC CO., LTD., Tokyo (JP)

(72) Inventors: Kenichi Furukawa, Sagamihara (JP); Takayuki Numakunai, Tama (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 499 days.

(21) Appl. No.: 15/313,009

(22) PCT Filed: Feb. 24, 2015

(86) PCT No.: PCT/JP2015/055200
§ 371 (c)(1),
(2) Date: Nov. 21, 2016

(87) PCT Pub. No.: WO2015/182184
PCT Pub. Date: Dec. 3, 2015

(65) Prior Publication Data
US 2017/0207728 A1     Jul. 20, 2017

(30) Foreign Application Priority Data

May 26, 2014   (JP) ................................. 2014-108273

(51) Int. Cl.
*H02N 2/04*       (2006.01)
*H01L 41/00*     (2013.01)
(Continued)

(52) U.S. Cl.
CPC .............. *H02N 2/18* (2013.01); *H01L 41/125* (2013.01); *H02N 2/186* (2013.01)

(58) Field of Classification Search
CPC ......... H02N 2/18; H02N 2/186; H01L 41/125
(Continued)

(56) References Cited

U.S. PATENT DOCUMENTS 3,753,058 A * 8/1973 Edson ....................... B06B 1/08
                                                              310/26
5,907,211 A * 5/1999 Hall ...................... B64C 27/001
                                                              310/328

(Continued)

FOREIGN PATENT DOCUMENTS

| JP | 2013-208029 A | 10/2013 |
|----|---------------|---------|
| JP | 2014-096924   | 5/2014  |

(Continued)

OTHER PUBLICATIONS

International Search Report, PCT/JP2015/055200, dated May 26, 2015, 3 pages.

*Primary Examiner* — Thomas M Dougherty
(74) *Attorney, Agent, or Firm* — Miller Nash Graham & Dunn LLP

(57) ABSTRACT

Provided is a power generator 1. The power generator includes two magnetostrictive rods 2 arranged side by side and formed on a magnetostrictive material, coils 3 respectively wound around the magnetostrictive rods 2 and a beam member 73 having a function of generating stress in the two magnetostrictive rods 2. The power generator 1 is configured so that elastic energy stored in the beam member 73 is larger than elastic energy stored in each of the magnetostrictive rods 2 when tip end portions of the two magnetostrictive rods 2 and the beam member 73 are displaced with respect to base end portions of the two magnetostrictive rods 2 and the beam member 73 to deform the two magnetostrictive rods 2 and the beam member 73.

10 Claims, 11 Drawing Sheets

(51) Int. Cl.
*H02N 2/18* (2006.01)
*H01L 41/12* (2006.01)

(58) Field of Classification Search
USPC .......................................................... 310/26
See application file for complete search history.

(56) References Cited

U.S. PATENT DOCUMENTS

| | | | | |
|---|---|---|---|---|
| 7,456,530 | B2 * | 11/2008 | Ohashi | H01L 41/12 |
| | | | | 310/26 |
| 2005/0230973 | A1 * | 10/2005 | Fripp | E21B 41/0085 |
| | | | | 290/1 R |
| 2013/0140919 | A1 * | 6/2013 | Ueno | H01L 41/125 |
| | | | | 310/26 |
| 2015/0155472 | A1 | 6/2015 | Furukawa et al. | |
| 2016/0065093 | A1 | 3/2016 | Furukawa et al. | |
| 2016/0373032 | A1 * | 12/2016 | Furukawa | H01L 41/125 |
| 2017/0047866 | A1 * | 2/2017 | Furukawa | H02N 2/00 |
| 2017/0207728 | A1 * | 7/2017 | Furukawa | H02N 2/18 |

FOREIGN PATENT DOCUMENTS

| | | |
|---|---|---|
| WO | 2011158473 A1 | 12/2011 |
| WO | 2014021197 A1 | 2/2014 |
| WO | 2014168008 A1 | 10/2014 |

\* cited by examiner ial force.

POWER GENERATOR

FIELD OF THE INVENTION

The present invention relates to a power generator.

BACKGROUND ART

In recent years, there has been developed a power generator which can generate electric power by utilizing variation of magnetic permeability of a magnetostrictive rod formed of a magnetostrictive material (for example, see patent document 1).

For example, this power generator includes a pair of magnetostrictive rods arranged side by side, two connecting yokes for respectively connecting one end portions and the other end portions of the pair of magnetostrictive rods with each other, coils arranged so as to respectively surround the magnetostrictive rods, an elongated back yoke arranged along the pair of magnetostrictive rods and two permanent magnets respectively arranged between each of the two connecting yokes and the back yoke to apply a bias magnetic field to the magnetostrictive rods. The back yoke is fixed to the connecting yokes through the permanent magnets. With this configuration, a magnetic field loop circulating in the magnetostrictive rods, the connecting yokes, the permanent magnets and the back yoke is formed.

When one of the connecting yokes is fixed and external force is applied to the other one of the connecting yokes in a direction perpendicular to an axial direction of the magnetostrictive rods, one of the magnetostrictive rods is deformed so as to be expanded and the other one of the magnetostrictive rods is deformed so as to be contracted. Due to these deformations, elastic energy is stored in each of the magnetostrictive rods. When the external force applied to the other one of the connecting yokes is released, the elastic energy stored in each of the magnetostrictive rods is converted into kinetic energy and the other one of the connecting yokes is vibrated. In this described power generator, when the other one of the connecting yokes is vibrated and each of the magnetostrictive rods is deformed, stress (tensile stress or compressive stress) is generated in each of the magnetostrictive rods. The stress generated in each of the magnetostrictive rods leads to variation of density of lines of magnetic force (magnetic flux density) passing through the magnetostrictive rods, that is variation of the density of the lines of magnetic force passing through the coils, thereby generating a voltage in the coils.

In the described power generator, the pair of magnetostrictive rods constitute beams facing each other. In order to improve power generation efficiency of the power generator having such a configuration, it is necessary that each of magnetostrictive rods can be sufficiently deformed in an expanding and contracting direction by the stress generated by the other one of the magnetostrictive rods and has a function of generating sufficiently large stress in the other one of the magnetostrictive rods. However, it is difficult to allow the magnetostrictive rods to satisfy these conditions. Thus, it is impossible to sufficiently improve the power generation efficiency of the power generator by using the power generator having the above configuration.

RELATED ART

Patent Document

Patent document 1: WO 2011/158473

SUMMARY OF THE INVENTION

Problems to be Solved by the Invention

The present invention has been made in view of the problem mentioned above. Accordingly, it is an object of the present invention to provide a power generator which can efficiently generate electric power by utilizing applied external force.

Means for Solving the Problems

The above object is achieved by the present inventions defined in the following (1) to (10).

(1) A power generator, comprising:

a beam including at least one magnetostrictive rod formed of a magnetostrictive material and through which lines of magnetic force pass in an axial direction thereof, and a beam member arranged so as to face the at least one magnetostrictive rod and having a function of generating stress in the magnetostrictive rod; and a coil arranged so that the lines of magnetic force pass inside the coil in an axial direction of the coil whereby a voltage is generated in the coil due to variation of density of the lines of magnetic force, wherein the beam has one end portion and the other end portion, wherein the other end portion of the beam can be displaced with respect to the one end portion of the beam, and wherein the power generator is configured so that elastic energy stored in the beam member is larger than elastic energy stored in the magnetostrictive rod when the other end portion of the beam is displaced to deform the magnetostrictive rod and the beam member.

(2) The power generator according to the above (1), wherein each of the magnetostrictive rod and the beam member has a substantially constant cross-sectional shape in a short direction thereof, and when a Young's modulus of a constituent material of the beam member is defined as "Eh" [N/m$^2$], a second moment of area of a cross-sectional surface of the beam member in the short direction thereof is defined as "Ih" [m$^4$], a Young's module of the magnetostrictive material is defined as "Ej" [N/m$^2$] and a second moment of area of a cross-sectional surface of the magnetostrictive rod in the short direction thereof is defined as "Ij" [m$^4$], "Eh", "Ih", "Ej" and "Ij" satisfy a relationship of "Eh×Ih>Ej×Ij".

(3) The power generator according to the above (2), wherein when a cross-sectional area of the beam member in the short direction thereof is defined as "Ah" [m$^2$] and a cross-sectional area of the magnetostrictive rod in the short direction thereof is defined as "Aj" [m$^2$], the magnetostrictive rod and the beam member satisfy a relationship of "Eh×Ah>Ej×Aj".

(4) The power generator according to any one of the above (1) to (3), wherein a loss coefficient of a constituent material of the beam member is smaller than a loss coefficient of the magnetostrictive material.

(5) The power generator according to any one of the above (1) to (4), wherein when a loss coefficient of a constituent material of the beam member is defined as "$\eta_1$" and a loss coefficient of the magnetostrictive material is defined as "$\eta_2$", a value of $\eta_1/\eta_2$ is equal to or less than 0.3.

(6) The power generator according to any one of the above (1) to (5), wherein the magnetostrictive rod and the beam member are arranged so as not to overlap with each other in a side view.

(7) The power generator according to any one of the above (1) to (6), wherein a gap between the magnetostrictive rod and the beam member in a side view decreases from the side of the one end portion of the beam to the side of the other end portion of the beam.

(8) The power generator according to any one of the above (1) to (7), wherein the at least one magnetostrictive rod includes two or more of the magnetostrictive rods arranged side by side, and each of the magnetostrictive rods and the beam member are arranged so as not to overlap with each other in a planar view.

(9) The power generator according to the above (8), wherein the beam member is arranged between the magnetostrictive rods in the planar view.

(10) The power generator according to the above (8) or (9), wherein the coil includes coils respectively wound around the magnetostrictive rods, and each of the coils and the beam member are arranged so as not to overlap with each other in the planar view.

Effects of the Invention

According to the present invention, it is possible to make the elastic energy stored in the beam member larger than the elastic energy stored in the magnetostrictive rod when external force is applied to the beam for displacing the other end portion of the beam with respect to the one end portion of the beam to bend and deform the magnetostrictive rod and the beam member. When the external force applied to the beam is released in this state, the elastic energy respectively stored in the magnetostrictive rod and the beam member is converted into kinetic energy for vibrating the other end portion of the beam (the power generator). In the power generator of the present invention, since the elastic energy caused by a bending deformation and stored in the beam member when the external force is applied is large, it is also possible to make the kinetic energy for vibrating the other end portion of the beam larger. Further, since this vibration of the other end portion of the beam allows the kinetic energy to be efficiently consumed for deforming the magnetostrictive rod (in an expanding or contracting direction), it is possible to improve power generation efficiency of the power generator.

DETAILED DESCRIPTION OF THE PREFERRED EMBODIMENTS

Hereinafter, description will be given to a power generator of the present invention with reference to preferred embodiments shown in the accompanying drawings.

First Embodiment

First, description will be given to a first embodiment of the power generator of the present invention.

Figure 1:
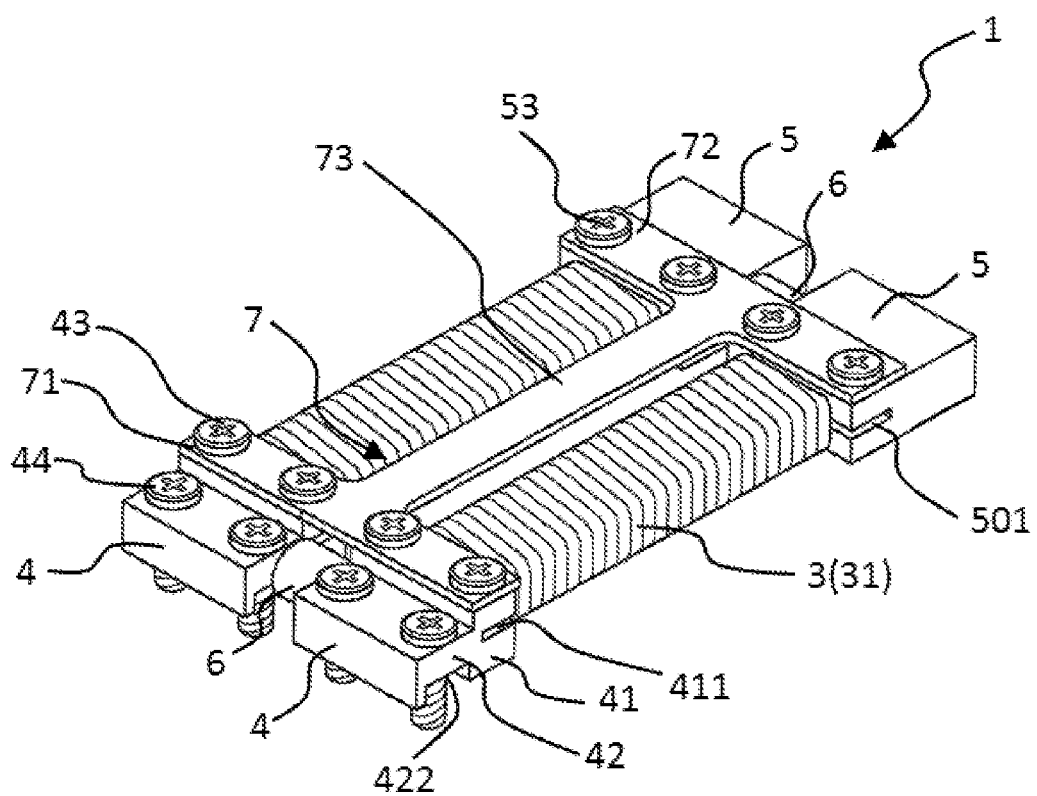
FIG. 1 is a perspective view showing a first embodiment of a power generator of the present invention.
Figure 2:
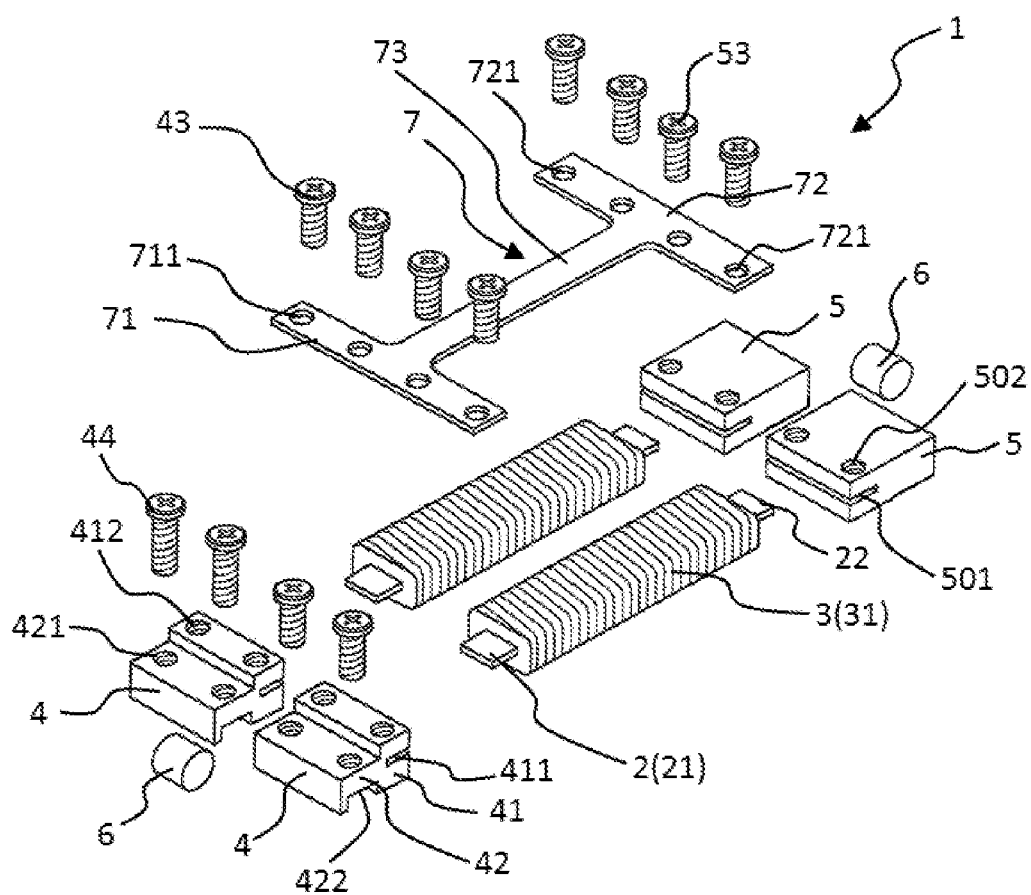
FIG. 2 is an exploded perspective view showing the power generator shown in FIG. 1.
Figure 3:
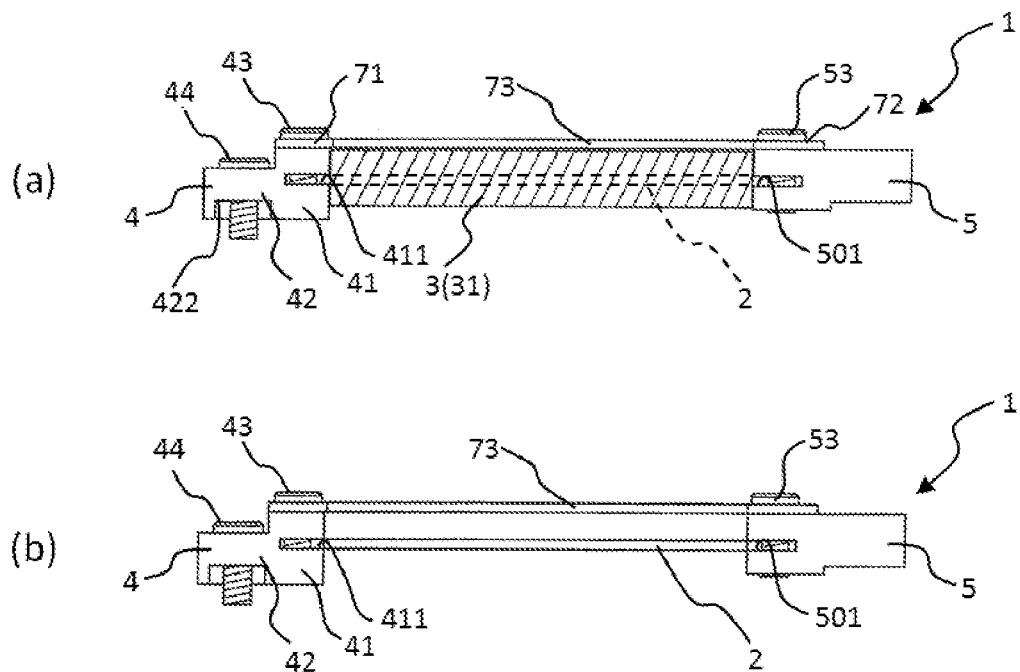
FIG. 3(a) is a side view of the power generator shown in FIG. 1.
FIG. 3(b) is a view showing a state that coils are removed from the power generator shown in FIG. 3(a).
Figure 4:
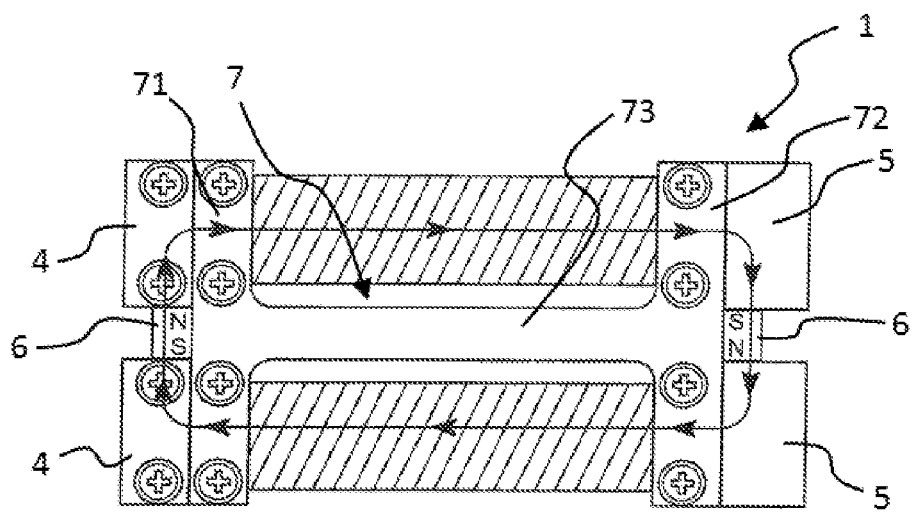
FIG. 4 is a planar view of the power generator shown in FIG. 1.
Figure 5:
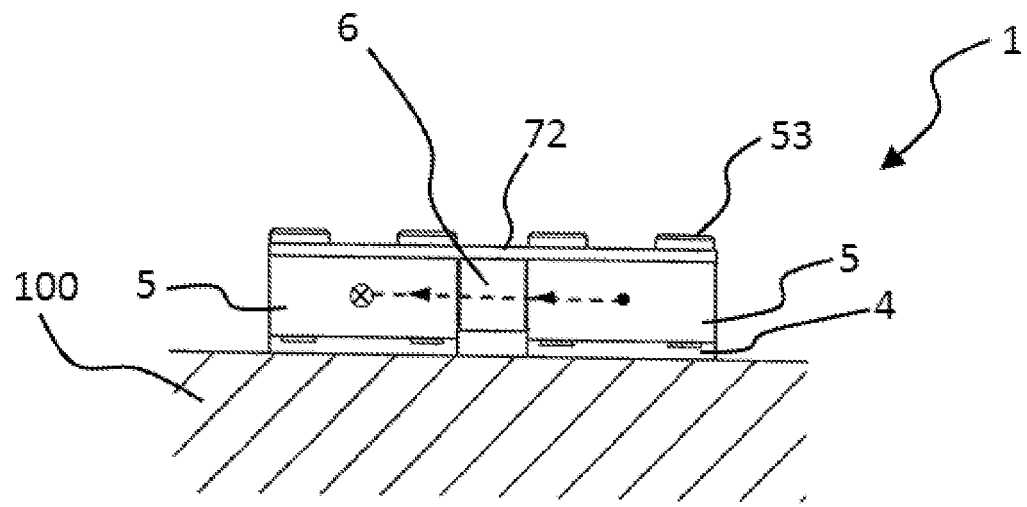
FIG. 5 is a front view of the power generator shown in FIG. 1.
Figure 6:
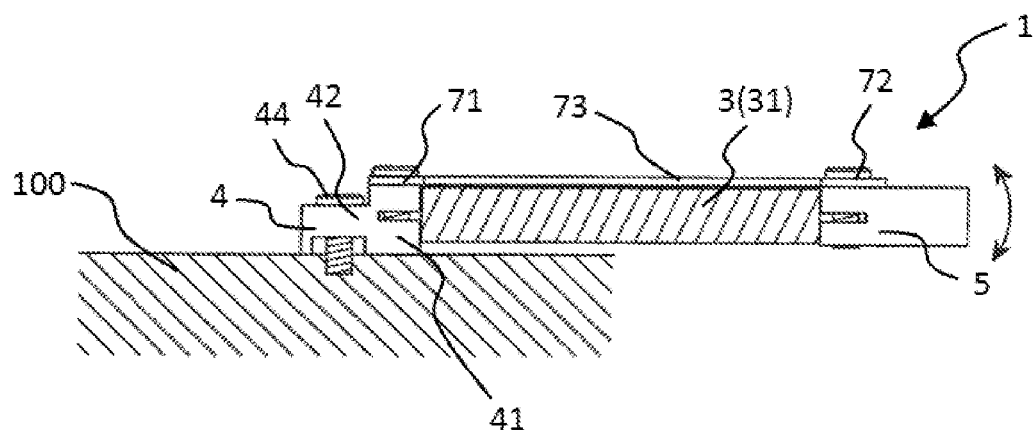
FIG. 6 is a side view for explaining a state that the power generator shown in FIG. 1 is attached to a vibrating body.

FIG. 1 is a perspective view showing the first embodiment of the power generator of the present invention. FIG. 2 is an exploded perspective view showing the power generator shown in FIG. 1. FIG. 3(a) is a side view of the power generator shown in FIG. 1. FIG. 3(b) is a view showing a state that coils are removed from the power generator shown in FIG. 3(a). FIG. 4 is a planar view of the power generator shown in FIG. 1. FIG. 5 is a front view of the power generator shown in FIG. 1. FIG. 6 is a side view for explaining a state that the power generator shown in FIG. 1 is attached to a vibrating body.

Hereinafter, an upper side in each of FIGS. 1, 2, 3(a), 3(b), 5 and 6 and a front side of the paper in FIG. 4 are referred to as "upper" or "upper side" and a lower side in each of FIGS. 1, 2, 3(a), 3(b), 5 and 6 and a rear side of the paper in FIG. 4 are referred to as "lower" or "lower side". Further, a right and rear side of the paper in each of FIGS. 1 and 2 and a right side of each of FIGS. 3(*a*), 3(*b*), 4 and 6 are referred to as "tip end side" and a left and front side of the paper in each of FIGS. 1 and 2 and a left side in each of FIGS. 3(*a*), 3(*b*), 4 and 6 are referred to as "base end side".

A power generator 1 shown in FIGS. 1 and 2 includes magnetostrictive rods 2 through which lines of magnetic force pass in an axial direction thereof, a beam member 73 having a function of generating stress in each of the magnetostrictive rods 2 and coils 3 arranged so that the lines of magnetic force pass inside the coils 3 in an axial direction of each of the coils 3. Each of the magnetostrictive rods 2 has a base end portion (one end portion) 21 and a tip end portion (the other end portion) 22. In the power generator 1, the tip end portion 22 of each of the magnetostrictive rods 2 is displaced with respect to the base end portion 21 of each of the magnetostrictive rods 2 in a direction substantially perpendicular to the axial direction thereof (in the vertical direction in FIG. 1) to expand and contract each of the magnetostrictive rods 2 in a longitudinal direction thereof. At this time, magnetic permeability of each of the magnetostrictive rods 2 varies due to an inverse magnetostrictive effect. This variation of the magnetic permeability of each magnetostrictive rod 2 leads to variation of density of the lines of magnetic force passing through the magnetostrictive rods 2 (density of the lines of magnetic force passing through the coils 3), thereby generating a voltage in the coils 3. In this embodiment, the power generator 1 is fixed to a housing 100.

Hereinafter, description will be given to each component of the power generator 1.

(Magnetostrictive Rod 2)

As shown in FIGS. 1 and 2, the power generator 1 of this embodiment includes the two magnetostrictive rods 2 arranged side by side. Each of the magnetostrictive rods 2 is formed of a magnetostrictive material and arranged so that a direction in which magnetization is easily generated (an easy magnetization direction) coincides with the axial direction thereof. In this embodiment, each of the magnetostrictive rods 2 has an elongated plate-like shape so that the lines of magnetic force pass through each of the magnetostrictive rods 2 in the axial direction thereof.

It is preferable that a transverse cross-sectional shape (cross-sectional shape in a short direction) of each of the magnetostrictive rods 2 is substantially constant along the axial direction thereof. An average thickness of each of the magnetostrictive rods 2 is not particularly limited to a specific value, but is preferably in the range of about 0.3 to 10 mm, and more preferably in the range of about 0.5 to 5 mm. Further, an average value of a cross-sectional area of each of the magnetostrictive rods 2 is preferably in the range of about 0.2 to 200 mm$^2$, and more preferably in the range of about 0.5 to 50 mm$^2$. With this configuration, it is possible to reliably pass the lines of magnetic force through the magnetostrictive rods 2 in the axial direction thereof.

A Young's modulus of the magnetostrictive material is preferably in the range of about 40 to 100 GPa, more preferably in the range of about 50 to 90 GPa, and even more preferably in the range of about 60 to 80 GPa. By forming the magnetostrictive rods 2 with the magnetostrictive material having the above Young's modulus, it is possible to expand and contract the magnetostrictive rods 2 more drastically. Since this allows the magnetic permeability of each of the magnetostrictive rods 2 to vary more drastically, it is possible to more improve power generation efficiency of the power generator 1 (the coils 3).

The magnetostrictive material having the above Young's modulus is not particularly limited to a specific kind. Examples of such a magnetostrictive material include an iron-gallium based alloy, an iron-cobalt based alloy, an iron-nickel based alloy and a combination of two or more of these materials. Among them, a magnetostrictive material containing an iron-gallium based alloy (having a Young's modulus of about 70 GPa) as a main component thereof is preferably used. A Young's modulus of the magnetostrictive material containing the iron-gallium based alloy as the main component thereof can be easily adjusted to fall within the above range.

Further, it is preferable that the magnetostrictive material described above contains at least one of rare-earth metals such as Y, Pr, Sm, Tb, Dy, Ho, Er and Tm. By using the magnetostrictive material containing at least one rare-earth metal mentioned above, it is possible to more increase the variation of the magnetic permeability of each of the magnetostrictive rods 2.

A loss coefficient of such a magnetostrictive material is in the range of about $9 \times 10^{-4}$ to $9 \times 10^{-2}$.

The coils 3 are respectively wound around outer peripheries of the two magnetostrictive rods 2 (arranged on the outer peripheral sides of the two magnetostrictive rods 2) so as to respectively surround a portion of each magnetostrictive rod 2 except for both end portions 21, 22 of the magnetostrictive rod 2.

(Coil 3)

Each of the coils 3 is formed by winding a wire 31 around each magnetostrictive rod 2. With this configuration, the coils 3 are arranged so that the lines of magnetic force passing through the magnetostrictive rods 2 pass inside the coils 3 (inner cavities of the coils 3) in an axial direction of the coils 3 (in this embodiment, the axial direction of the coils 3 is equivalent to the axial direction of the magnetostrictive rods 2). Due to the variation of the magnetic permeability of each of the magnetostrictive rods 2, that is, due to the variation of the density of the lines of magnetic force (magnetic flux density) passing through the magnetostrictive rods 2, the voltage is generated in the coils 3.

In the power generator 1 of this embodiment, the magnetostrictive rods 2 are arranged side by side in not a thickness direction thereof but a width direction thereof. Thus, it is possible to make a gap between the magnetostrictive rods 2 larger at the time of designing the power generator 1. Therefore, it is possible to sufficiently ensure spaces for the coils 3 wound around the magnetostrictive rods 2, thereby increasing a winding number of each of the coils 3 even if a wire 31 having a relatively large cross-sectional area (diameter) is used for forming each of the coils 3. Since the wire 31 having a large diameter has a small resistance value (small load impedance), it is possible to allow electric current to flow in the coils 3 efficiently, thereby efficiently utilizing the voltage generated in the coils 3.

The voltage $\varepsilon$ generated in the coils 3 can be expressed by the following formula (1) based on the variation of the magnetic flux density of each of the magnetostrictive rods 2.

$$\varepsilon = N \times \Delta B / \Delta T \tag{1}$$

(wherein "N" is the winding number of the wire 31, "$\Delta B$" is a variation amount of the magnetic flux passing in the inner cavities of the coils 3 and "$\Delta T$" is a variation amount of time.)

As is clear from the above formula (1), the voltage $\varepsilon$ generated in each of the coils 3 is proportional to the winding number of the wire 31 and the variation amount of the magnetic flux density of each of the magnetostrictive rods 2 (ΔB/ΔT). Thus, it is possible to improve the power generation efficiency of the power generator 1 by increasing the winding number of the wire 31.

The wire 31 is not particularly limited to a specific type. Examples of the wire 31 include a wire obtained by covering a copper base line with an insulating layer, a wire obtained by covering a copper base line with an insulating layer to which an adhesive (fusion) function is imparted and a combination of two or more of these wires.

The winding number of the wire 31 is not particularly limited to a specific value, but is preferably in the range of about 1000 to 10000, and more preferably in the range of about 2000 to 9000. With this configuration, it is possible to more increase the voltage generated in each of the coils 3.

Further, the cross-sectional area of the wire 31 is not particularly limited to a specific value, but is preferably in the range of about $5 \times 10^{-4}$ to $0.15 \text{ mm}^2$, and more preferably in the range of about $2 \times 10^{-3}$ to $0.08 \text{ mm}^2$. Since the wire 31 with such a cross-sectional area of the above range has a sufficiently small resistance value, it is possible to efficiently output the electric current flowing in each of the coils 3 to the outside with the generated voltage. As a result, it is possible to more improve the power generation efficiency of the power generator 1.

A cross-sectional shape of the wire 31 may be any shape. Examples of the cross-sectional shape of the wire 31 include a polygonal shape such as a triangular shape, a square shape, a rectangular shape and a hexagonal shape; a circular shape and an elliptical shape.

Although this matter is not shown in the drawings, both end portions of the wire 31 of each of the coils 3 are connected to an electric circuit such as a wireless device (wireless communication device). With this configuration, it is possible to utilize the voltage (electric power) generated in the coils 3 for the electric circuit.

First block bodies 4 are provided on the base end side of each magnetostrictive rod 2.

(First Block Body 4)

The first block bodies 4 serve as a fixing portion for fixing the power generator 1 to the housing 100. By fixing the power generator 1 to the housing 100 through the first block bodies 4, each of the magnetostrictive rods 2 is supported in a cantilevered state that the base end portions 21 of the magnetostrictive rods 2 serve as fixed end portions and the tip end portions 22 of the magnetostrictive rods 2 serve as movable end portions. By providing the power generator 1 with a mechanism for fixing the first block bodies 4 to the housing 100 and directly applying the external force to the tip end portion of the power generator 1 (second block bodies 5 described below) from the outside and combining the power generator 1 with a wireless communication device, it is possible to use the power generator 1 as a switching device which can be manually operated by a user. Concrete examples of the switching device will be described later.

As shown in FIGS. 1 and 2, each of the first block bodies 4 has a tall block body 41 provided on the tip end side and a short block body 42 shorter (thinner) than this tall block body 41. An external shape of each of the first block bodies 4 is a step-wise shape (multi-level shape).

A slit 411 is formed on a substantially central portion of the tall block body 41 in a thickness direction thereof along a width direction of the tall block body 41. The base end portion 21 of the magnetostrictive rod 2 is inserted (received) into this slit 411. Further, a pair of female screw portions 412 are formed in both end portions of the tall block body 41 in the width direction thereof so as to pass through the tall block body 41 in the thickness direction thereof. Male screws 43 are respectively screwed into the female screw portions 412.

A pair of female screw portions 421 are formed in both end portions of the short block body 42 in a width direction thereof so as to pass through the short block body 42 in a thickness direction thereof. Male screws 44 are respectively screwed into the female screw portions 421. By screwing these male screws 44 into a housing and the like through the female screw portions 421, it is possible to fix the first block bodies 4 to the housing.

Further, a groove 422 is formed on a lower surface of the short block body 42 so as to extend in the width direction of the short block body 42. Thus, since each of the first block bodies 4 is fixed to the housing 100 through two portions (that is a portion on the base end side (the short block body 42) and a portion on the tip end side (the tall block body 41, mainly) facing each other through the groove 422), each of the first block bodies 4 is configured so as to be easily deformed (bent) in the vicinity of the groove 422.

On the other hand, the second block bodies 5 are provided on the tip end side of the magnetostrictive rods 2.

(Second Block Body 5)

Each of the second block bodies 5 serves as a weight (mass portion) for applying external force or vibration to the magnetostrictive rods 2. External force is applied to the second block bodies 5 in the lower direction to displace the second block bodies 5 in the lower direction. When the external force is then released, the second block bodies 5 are vibrated in the vertical direction. At this time, the tip end portions 22 of the magnetostrictive rods 2 begin reciprocating motion in the vertical direction in the cantilevered state that the base end portions 21 of the magnetostrictive rods 2 serve as the fixed end portions and the tip end portions 22 of the magnetostrictive rods 2 serve as the movable end portions. Namely, the tip end portions 22 of the magnetostrictive rods 2 are relatively displaced with respect to the base end portions 21 of the magnetostrictive rods 2.

As shown in FIGS. 1 and 2, each of the second block bodies 5 has a substantially rectangular parallelepiped shape. A slit 501 is formed on a substantially central portion in a thickness direction of a base end surface of each of the second block bodies 5 so as to extend in a width direction thereof. The tip end portions 22 of the magnetostrictive rods 2 are respectively inserted into these slits 501. In this embodiment, each of the second block bodies 5 is configured so that a length from an upper surface of each block body 5 to the slit 501 is substantially equal to a length from an upper surface of the tall block body 41 of each first block body 4 to the slit 411.

Further, a pair of female screw portions 502 are formed in both end portions of each of the second block bodies 5 in the width direction thereof so as to pass through each of the second block bodies 5 in the thickness direction thereof. Male screws 53 are respectively screwed into the female screw portions 502.

A constituent material for each of the first block bodies 4 and the second block bodies 5 is not particularly limited to a specific kind as long as it has an enough stiffness for reliably fixing the end portions 21, 22 of the magnetostrictive rods 2 to each block body 4, 5 and generating uniform stress in the magnetostrictive rods 2 and enough ferromagnetism for applying a bias magnetic field generated from two permanent magnets 6 to the magnetostrictive rods 2. Examples of the constituent material having the above properties include a pure iron (e.g., "JIS SUY"), a soft iron, a carbon steel, a magnetic steel (silicon steel), a high-speed tool steel, a structural steel (e.g., "JIS SS400"), a stainless, a permalloy and a combination of two or more of these materials.

A width of each of the first block bodies 4 and the second block bodies 5 is designed so as to be larger than a width of the magnetostrictive rod 2. Specifically, each of the first block bodies 4 and the second block bodies 5 has a width which enables the magnetostrictive rods 2 to be arranged between the pairs of female screw portions 412, 502 when the magnetostrictive rods 2 are inserted into the slits 411, 501 of each block body 4, 5. The width of each block body 4, 5 as described above is preferably in the range of about 3 to 15 mm, and more preferably in the range of about 5 to 10 mm. By setting the width of each block body 4, 5 to fall within the above range, it is possible to downsize the power generator 1 and sufficiently ensure a size of each of the coils 3 respectively wound around the magnetostrictive rods 2.

The two permanent magnets 6 for applying the bias magnetic field to the magnetostrictive rods 2 are respectively provided between the first block bodies 4 and between the second block bodies 5.

(Permanent Magnet 6)

Each of the permanent magnets 6 has a columnar shape.

As shown in FIG. 4, the permanent magnet 6 provided between the first block bodies 4 is arranged so that its south pole is directed toward the lower side in FIG. 4 and its north pole is directed toward the upper side in FIG. 4. Further, the permanent magnet 6 provided between the second block bodies 5 is arranged so that its south pole is directed toward the upper side in FIG. 4 and its north pole is directed toward the lower side in FIG. 4. Namely, each of the permanent magnets 6 is arranged so that a magnetization direction of each of the permanent magnets coincides with an arrangement direction of the magnetostrictive rods 2 (see FIG. 5). With this configuration, a magnetic field loop circulating in the clockwise direction is formed in the power generator 1.

As the permanent magnet 6, it is possible to use an alnico magnet, a ferrite magnet, a neodymium magnet, a samarium-cobalt magnet, a magnet (a bonded magnet) obtained by molding a composite material prepared by pulverizing and mixing at least one of these magnets with a resin material or a rubber material, or the like. In order to more fixedly attach the permanent magnets 6 to each block body 4, 5, it is preferable to use a method for bonding the permanent magnets 6 to each block body 4, 5 with an adhesive agent or the like.

In the power generator 1, the permanent magnet 6 provided between the second block bodies 5 is configured to be displaced together with the second block bodies 5. Thus, friction does not occur between the second block bodies 5 and the permanent magnet 6. Since energy for displacing the second block bodies 5 is not consumed by this friction in the power generator 1, the power generator 1 can efficiently generate the electric power.

The magnetostrictive rods 2 as described above are connected with each other by a connecting portion 7 through the first block bodies 4 and the second block bodies 5.

(Connecting Portion 7)

The connecting portion 7 includes a first connecting member 71 for connecting the first block bodies 4 with each other, a second connecting member 72 for connecting the second block bodies 5 with each other and one beam member 73 for connecting the first connecting member 71 and the second connecting member 72. The connecting portion 7 is formed of a weakly magnetic material or a non-magnetic material.

In this embodiment, each of the first connecting member 71, the second connecting member 72 and the beam member 73 has a belt-like shape (elongated plate-like shape). The connecting portion 7 has an H-like shape in a planar view as a whole. Although the connecting portion 7 may take a configuration in which the members are connected with each other with a welding method or the like, it is preferable that the connecting portion 7 takes a configuration in which the members are formed integrally with each other.

The first connecting member 71 includes four through-holes 711 formed at four positions respectively corresponding to the four female screw portions 412 formed in the two first block bodies 4. The male screws 43 are screwed with the female screw portions 412 passing through the through-holes 711 of the first connecting member 71 in a state that the base end portions 21 of the magnetostrictive rods 2 are inserted into the slits 411. With this configuration, the first connecting member 71 is screw-fixed to each of the tall block bodies 41 of the first block bodies 4 and spaces in the slits 411 are narrowed to fix the base end portions 21 (the magnetostrictive rods 2) to the first block bodies 4.

The second connecting member 72 includes four through-holes 721 formed at four positions respectively corresponding to the four female screw portions 502 formed in the two second block bodies 5. The male screws 53 are screwed with the female screw portions 502 passing through the through-holes 721 of the second connecting member 72 in a state that the tip end portions 22 of the magnetostrictive rods 2 are inserted into the slits 501. With this configuration, the second connecting member 72 is screw-fixed to the second block bodies 5 and spaces in the slits 501 are narrowed to fix the tip end portions 22 (the magnetostrictive rods 2) to the second block bodies 5.

As described above, the magnetostrictive rods 2 and the first connecting member 71 are fastened to the first block bodies 4 with the male screws 43, and the magnetostrictive rods 2 and the second connecting member 72 are fastened to the second block bodies 5 with the male screws 53. Thus, it is possible to reduce the number of parts and the number of steps for fixing and connecting the members with each other. In this regard, a fixing and connecting method is not limited to the above screwing method. Examples of the fixing and connecting method include a bonding method with an adhesive agent, a brazing method and a welding method (such as a laser welding method and an electric welding method).

By adjusting lengths of the first connecting member 71 and the second connecting member 72, it is possible to change the gap between the magnetostrictive rods 2. By enlarging the gap between the magnetostrictive rods 2, it is possible to sufficiently ensure spaces for respectively winding the coils 3 around the magnetostrictive rods 2. With this configuration, it is possible to sufficiently enlarge the sizes of the coils 3, thereby improving the power generation efficiency of the power generator 1.

The beam member 73 connects a central portion of the first connecting member 71 and a central portion of the second connecting member 72. In the power generator 1, this beam member 73 and the magnetostrictive rods 2 are arranged so as not to overlap with each other in the planar view (see FIG. 4). Further, the beam member 73 and the magnetostrictive rods 2 are arranged parallel to each other with being spaced apart from each other by a predetermined distance in the side view (see FIG. 3). In this embodiment, a width of the beam member 73 is set so as to be smaller than a gap between the coils 3 respectively wound around the magnetostrictive rods 2. Further, a height position of a lower surface of the beam member 73 substantially coincides with a height position of an upper surface of each of the coils 3 in the side view.

In the power generator 1, the two magnetostrictive rods 2 and the beam member 73 serve as beams (parallel beams) facing each other. The magnetostrictive rods 2 and the beam member 73 are displaced in the same direction (the upper direction or the lower direction in FIG. 1) together when the second block bodies 5 are displaced. At this time, since the beam member 73 is arranged between the magnetostrictive rods 2, each of the magnetostrictive rods 2 does not make contact with the beam member 73 when each of the magnetostrictive rods 2 is displaced.

As shown in FIG. 6, the power generator 1 as described above is used in a state that the first block bodies 4 are fixed to the housing 100 through the male screws 44. In this state, when the second block bodies 5 are displaced in the lower direction by applying the external force to the second block bodies in the lower direction and then releasing the applied external force, the second block bodies 5 are vibrated in the vertical direction. When the second block bodies 5 are displaced (pivotally moved) with respect to the first block bodies 4 in the lower direction by the vibration of the second block bodies 5, that is when the tip end portions 22 of the magnetostrictive rods 2 are displaced with respect to the base end portions 21 of the magnetostrictive rods 2 in the lower direction, the beam member 73 is deformed so as to be expanded in an axial direction thereof and the magnetostrictive rods 2 are deformed so as to be contracted in the axial direction thereof. On the other hand, when the second block bodies 5 are displaced (pivotally moved) in the upper direction, that is when the tip end portions of the magnetostrictive rods 2 are displaced with respect to the base end portions 21 of the magnetostrictive rods 2 in the upper direction, the beam member 73 is deformed so as to be contracted in the axial direction thereof and the magnetostrictive rods 2 are deformed so as to be expanded in the axial direction thereof. As a result, the magnetic permeability of each of the magnetostrictive rods 2 varies due to the inverse magnetostrictive effect. This variation of the magnetic permeability of each of the magnetostrictive rods 2 leads to the variation of the density of the lines of magnetic force passing through the magnetostrictive rods 2 (the density of the lines of magnetic force passing through the coils 3), thereby generating the voltage in the coils 3.

In the power generator 1 described above, when external force is applied to a tip end portion (the second block bodies 5) of a beam constituted of the two magnetostrictive rods 2 and the beam member 73, the tip end portion (other end portion) of the beam is displaced with respect to a base end portion (one end portion) of the beam. As a result, the magnetostrictive rods 2 and the beam member 73 are deformed. At this time, elastic energy stored in the beam member 73 is larger than elastic energy stored in each of the two magnetostrictive rods 2.

As described above, in the power generator 1, the two magnetostrictive rods 2 and the beam member 73 serve as the pair of beams facing each other. Thus, in the power generator 1, the two magnetostrictive rods 2 and the beam member 73 are deformed in the same direction when the external force is applied to the second block bodies 5. At this time, one of the beam member 73 and the pair of two magnetostrictive rods 2 is deformed so as to be expanded and the other of the beam member 73 and the pair of two magnetostrictive rods 2 is deformed so as to be contracted. Due to these deformations, the elastic energy is stored in each of the magnetostrictive rods 2 and the beam member 73. When the elastic energy is converted into kinetic energy, the second block bodies 5 are vibrated in the vertical direction.

In the power generator 1, since the elastic energy stored in the beam member 73 when the external force is applied is large, it is possible to increase the kinetic energy for vibrating the second block bodies 5 in the vertical direction. Further, since the kinetic energy is efficiently consumed by the vibration of the second block bodies 5 for deforming the magnetostrictive rods 2 (for the deformation in the expanding and contracting direction), it is possible to improve the power generation efficiency of the power generator 1.

In this regard, elastic energy U [J] stored in each member constituting a pair of beams when each member is deformed as is the case for the power generator 1 can be expressed by the following formula (2) using a spring constant K [K/m] and a displacement amount (bending amount) $\Delta S$ [m] of each member.

$$U = \frac{1}{2} \times K \times \Delta S^2 \quad (2)$$

In the power generator 1, the beam member 73 and the magnetostrictive rods 2 are displaced in the same direction when the external force is applied and displacement amounts of the beam member 73 and the magnetostrictive rods 2 are substantially equal to each other. Thus, by setting a spring constant of the beam member 73 to be larger than a spring constant of each of the magnetostrictive rods 2, it is possible to make the elastic energy stored in the beam member 73 larger than the elastic energy stored in each of the magnetostrictive rods 2.

In this regard, each of the deformations of the beam member 73 and the magnetostrictive rods 2 in the power generator 1 contains two deformations. One of the two deformations is a deformation (bending deformation) in a direction in which the tip end portion of each member is displaced, that is a direction in which each member is bent (the vertical direction in FIG. 3). The other one of the two deformations is a deformation in a direction in which each member is expanded or contracted. Thus, the elastic energy stored in each member when each member is deformed is total energy of elastic energy caused by the bending deformation and elastic energy caused by the deformation in the expanding and contracting direction.

Generally, in the case where the same external force is applied to one beam member in both of the bending direction and the expanding and contracting direction of the one beam member, the elastic energy caused by the bending deformation and stored in the member is larger than the elastic energy caused by the deformation in the expanding and contracting direction and stored in the member. Specifically, the elastic energy caused by the bending deformation and stored in the member is tens of times of the elastic energy caused by the deformation in the expanding and contracting direction and stored in the member.

Thus, in order to more increase the elastic energy stored in the beam member 73, it is preferable that the power generator 1 is configured so that the elastic energy caused by the bending deformation can be stored in the beam member 73 more efficiently than the elastic energy caused by the deformation in the expanding and contracting direction.

On the other hand, when each of the magnetostrictive rods 2 is deformed in the expanding and contracting direction, the magnetic flux density of each of the magnetostrictive rods 2 is varied. As a result, each of the magnetostrictive rods 2 can contribute to the power generation. However, the magnetic flux density of each of the magnetostrictive rods 2 is not varied by the bending deformation. Thus, it is preferable that each of the magnetostrictive rods 2 is configured so that the elastic energy caused by the deformation in the expanding and contracting direction can be stored in each of the magnetostrictive rods 2 more efficiently than the elastic energy caused by the bending deformation.

Here, description will be given to force applied to each member of a structure having a pair of beams whose base end portions are fixed to a housing and tip end portions are fixed to a movable portion (mass portion) when the movable portion is vibrated and moment generated by the applied force.

Figure 7:
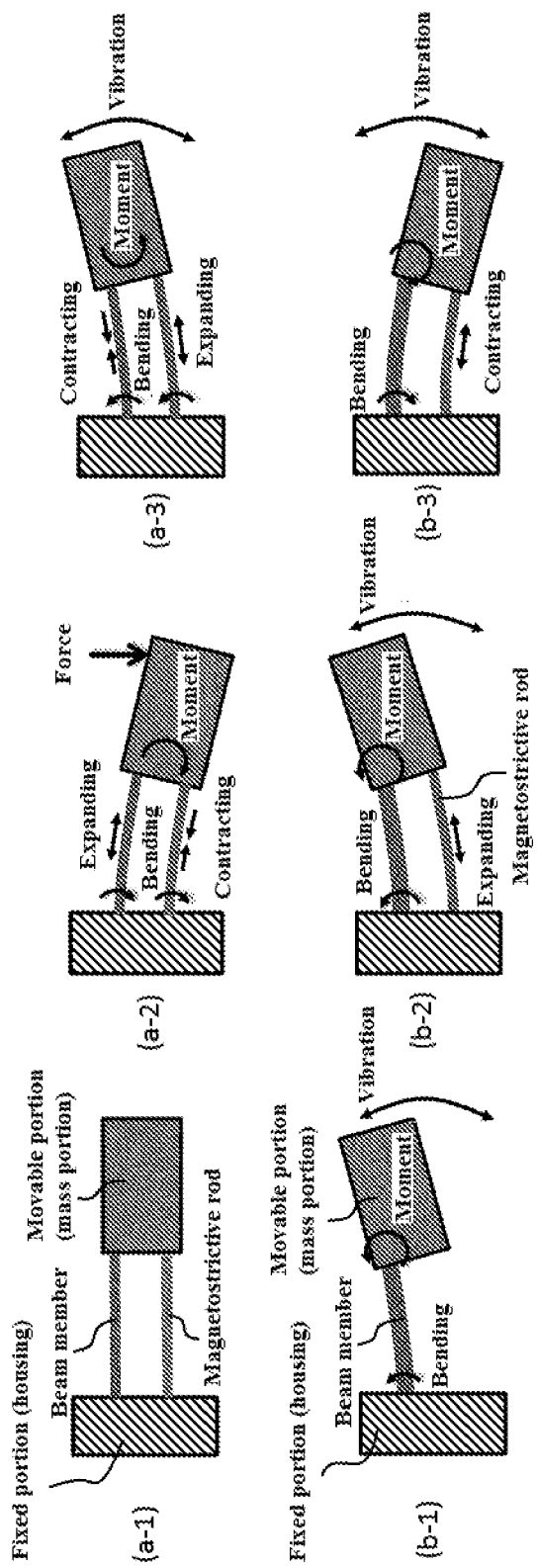
FIG. 7 is a side view showing a structure having a pair of parallel beams (a beam member and a magnetostrictive rod) whose base end portions are fixed to a housing and tip end portions are fixed to a movable portion (mass portion) for explaining force applied to each member when the movable portion is vibrated and moment generated by the applied force.

FIG. 7 is a side view showing a structure having a pair of parallel beams (a beam member and a magnetostrictive rod) whose base end portions are fixed to a housing and tip end portions are fixed to a movable portion (mass portion) for explaining force applied to each member of the structure when the movable portion is vibrated and moment generated by the applied force.

Specifically, each of FIGS. 7(a-1) to 7(a-3) shows a structure in the case of assuming that each of the beam member and the magnetostrictive rod constituting the beams has the same Young's modulus and the same shape. FIG. 7(b-1) shows a structure in which one member having a cross-sectional area and a Young's modulus larger than those of the beam member shown in FIG. 7(a-1) is used as the beam member supporting the movable portion. Further, each of FIGS. 7(b-2) and 7(b-3) shows a structure in which the beam member of the structure shown in FIG. 7(b-1) and a magnetostrictive rod having a cross-sectional area and a Young's modulus smaller than those of this beam member constitute a pair of beams.

Hereinafter, an upper side in FIG. 7 is referred to as "upper" or "upper side" and a lower side in FIG. 7 is referred to as "lower" or "lower side".

In the case where each of the beam member and the magnetostrictive rod has the same Young's modulus and the same shape, when external force is applied to the movable portion in the lower direction to displace the movable portion in the lower direction, each of the beam member and the magnetostrictive rod is bent and deformed in the lower direction. Further, the beam member is deformed so as to be expanded in the expanding direction and the magnetostrictive rod is deformed so as to be contracted in the contracting direction (see FIG. 7(a-2)). When the external force applied to the movable portion is released in this state, the movable portion is displaced in the upper direction and each of the beam member and the magnetostrictive rod is bent and deformed in the upper direction. Further, the beam member is deformed so as to be contracted in the contracting direction and the magnetostrictive rod is deformed so as to be expanded in the expanding direction (see FIG. 7(a-3)). After that, the bending deformations and the deformations in the expanding and contracting direction of the beam member and the magnetostrictive rod are repeated by rotational moment generated in the movable portion by the vibration of the movable portion in the vertical direction. Due to the vibration of the movable portion, force is applied to the beam member and the magnetostrictive rod in the displacement direction (the bending direction and the expanding and contracting direction).

On the other hand, the structure shown in FIG. 7(b-1) takes a configuration in which the member having the cross-sectional area and the Young's modulus larger than those of the beam member of the structure shown in FIG. 7(a-1) is used as the beam member and only the beam member supports the movable portion. In this configuration, when external force is applied to the movable portion to displace the movable portion in the lower direction, the beam member is bent and deformed in the lower direction. However, at this time, the beam member is not substantially deformed in the expanding and contracting direction. When the external force applied to the movable portion is released in this state, the movable portion is displaced in the upper direction. At this time, although the beam member is bent and deformed in the upper direction, the beam member is not substantially deformed in the expanding and contracting direction. After that, the beam member is also displaced in the vertical direction by the vibration of the movable portion in the vertical direction. At this time, the beam member is not substantially deformed in the expanding and contracting direction but deformed substantially only in the bending direction. Namely, when the external force is applied to the movable portion, only force substantially in the bending direction is applied to the beam member.

Here, it is assumed to take a configuration in which the magnetostrictive rod having the cross-sectional area and the Young's modulus smaller than those of the beam member is added to the described structure to constitute a pair of beams with the beam member and the magnetostrictive rod as shown in FIGS. 7(b-2) and 7(b-3). Even in this structure, when the external force is applied to the movable portion, only force substantially in the bending direction is applied to the beam member. In this structure, since stiffness of the magnetostrictive rod is smaller than stiffness of the beam member, when the beam member is bent and deformed by the displacement of the movable portion, the magnetostrictive rod is slightly bent and deformed following to the bending deformation of the beam member. When the external force is applied to the movable portion, force in the bending direction is not substantially applied to this magnetostrictive rod and only force substantially in the expanding and contracting direction is applied to this magnetostrictive rod.

Namely, in the structure shown in each of FIGS. 7(b-2) and 7(b-3), when the external force is applied to the movable portion, the elastic energy caused by the bending deformation is mainly stored in the beam member and the elastic energy caused by the deformation in the expanding and contracting direction is mainly stored in the magnetostrictive rod. In the case of employing the structure shown in each of FIGS. 7(b-2) and 7(b-3) in the power generator, it is possible to more improve the power generation efficiency of the power generator.

Hereinafter, detailed description will be given to the elastic energy stored in each member when the external force is applied to the movable portion (mass portion) in the structure as shown in FIG. 7.

Figure 8:
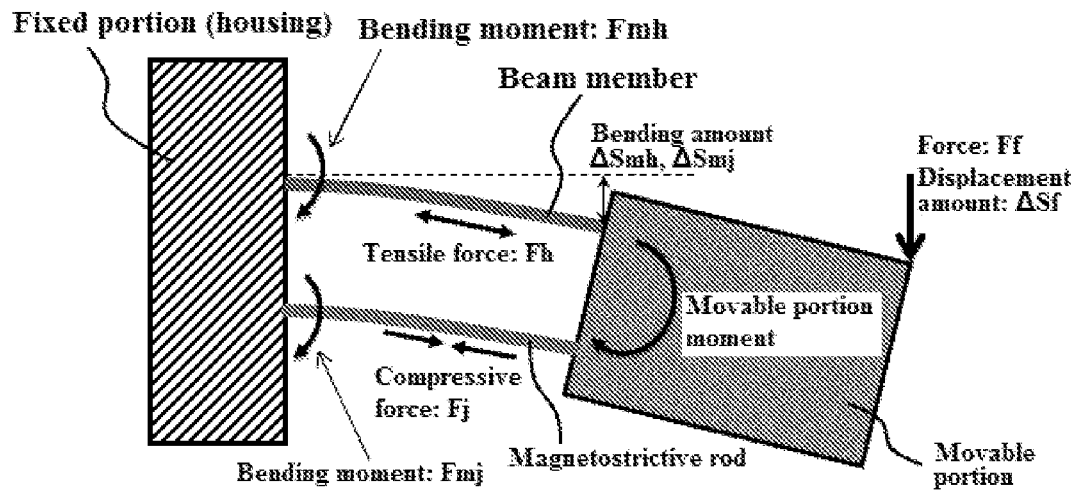
FIG. 8 is a side view showing the structure having the pair of parallel beams (the beam member and the magnetostrictive rod) whose base end portions are fixed to the housing and tip end portions are fixed to the movable portion (mass portion) for explaining elastic energy stored in each member when external force is applied to the movable portion.

FIG. 8 is a side view showing the structure having the pair of parallel beams (the beam member and the magnetostrictive rod) whose base end portions are fixed to the housing and tip end portions are fixed to the movable portion (mass portion) for explaining the elastic energy stored in each member when external force is applied to the movable portion.

Hereinafter, an upper side in FIG. 8 is referred to as "upper" or "upper side" and a lower side in FIG. 8 is referred to as "lower" or "lower side".

In the structure shown in FIG. 8, lengths of the beam member and the magnetostrictive rod are respectively "Lh" [m] and "Lj" [m] and the length Lh is substantially equal to the length Lj (Lh≈Lj). Further, a transverse cross-sectional shape (cross-sectional shape in a short direction) of each of the beam member and the magnetostrictive rod is substantially constant along a longitudinal direction thereof. Cross-sectional areas of the beam member and the magnetostrictive rod are respectively "Ah" [m$^2$] and "Aj" [m$^2$]. Young's moduli of the beam member and the magnetostrictive rod are respectively "Eh" [N/m] and "Ej" [N/m]. Second moment of area of a transverse cross-sectional surface (cross-sectional surface in the short direction) of the beam member and the magnetostrictive rod is respectively "Ih" [m$^4$] and "Ij" [m$^4$].

A spring constant of an entire of this structure is defined as "Kf" [N/m], external force applied to the movable portion in the lower direction is defined as "Ff" [N] and a displacement amount (bending amount) in the lower direction caused by the applied external force is defined as "ΔSf" [m]. In this case, elastic energy Uf [J] caused by the applied external force Ff and stored in the structure can be expressed by the following formula (2-1).

$$Uf = \tfrac{1}{2} \times Ff \times \Delta Sf = \tfrac{1}{2} \times Kf \times \Delta Sf^2 \tag{2-1}$$

When the external force Ff is applied to the movable portion to displace the movable portion, each of the beam member and the magnetostrictive rod is deformed in the bending direction (the vertical direction in FIG. 8) and the expanding and contracting direction (the longitudinal direction of each member).

At this time, displacement amounts (bending amounts) in the bending direction of the tip end portions of the beam member and the magnetostrictive rod are respectively "ΔSmh" [m] and "ΔSmj" [m] and the displacement amount ΔSmh is substantially equal to the displacement amount ΔSmj (ΔSmh≈ΔSmj). Moment in the bending direction (force applied in the bending direction) of the beam member and the magnetostrictive rod is respectively "Fmh" [N] and "Fmj" [N]. Spring constants in the bending direction of the beam member and the magnetostrictive rod are respectively "Kmh" [N/m] and "Kmj" [N/m]. The elastic energy caused by the bending deformation and stored in the beam member and the magnetostrictive rod is respectively "Umh" [J] and "Umj" [J].

Deformation amounts in the expanding and contracting direction of the beam member and the magnetostrictive rod are respectively "ΔLh" [m] and "ΔLj" [m] and the deformation amount ΔLh is substantially equal to the deformation amount ΔLj (ΔLh≈ΔLj). Force applied to the beam member and the magnetostrictive rod in the expanding and contracting direction is respectively "ΔFh" [N] and "ΔFj" [N]. Spring constants in the expanding and contracting direction of the beam member and the magnetostrictive rod are respectively "Kh" [N/m] and "Kj" [N/m]. The elastic energy caused by the deformation in the expanding and contracting direction and stored in the beam member and the magnetostrictive rod is respectively "Uh" [J] and "Uj" [J].

The elastic energy Uf stored in the structure shown in FIG. 8 when the external force Ff is applied to the movable portion can be expressed by the following formula (2-2) using the elastic energy Umh [J], Umj [J] caused by the bending deformation and respectively stored in the beam member and the magnetostrictive rod and the elastic energy Uh [J], Uj [J] caused by the deformation in the expanding and contracting direction and respectively stored in the beam member and the magnetostrictive rod.

$$Uf \approx Umh + Umj + Uh + Uj \tag{2-2}$$

The elastic energy Umh, Umj caused by the bending deformation and respectively stored in the beam member and the magnetostrictive rod can be respectively expressed by the following formulas (2-3) and (2-4).

$$Umh = \tfrac{1}{2} \times Kmh \times \Delta Smh^2 \tag{2-3}$$

$$Umj = \tfrac{1}{2} \times Kmj \times \Delta Smj^2 \tag{2-4}$$

As described above, since the relationship of "ΔSmh≈ΔSmj" is satisfied, the elastic energy Umh, Umj satisfies a relationship represented by the following formula (2-5).

$$Umh \propto Kmh,\ Umj \propto Kmj \tag{2-5}$$

The spring constants Kmh, Kmj in the bending direction can be respectively expressed by the following formulas (2-6) and (2-7).

$$Kmh = 3 \times Eh \times Ih / Lh^3 \tag{2-6}$$

$$Kmj = 3 \times Ej \times Ij / Lj^3 \tag{2-7}$$

Further, as described above, since the relationship of "Lh≈Lj" is satisfied, it can be found from the above formulas (2-5) to (2-7) that the elastic energy Umh, Umj satisfies a relationship represented by the following formula (2-8).

$$Umh \propto Eh \times Ih,\ Umj \propto Ej \times Ij \tag{2-8}$$

As is clear from the above formula (2-8), the elastic energy caused by the bending deformation and stored in each of the beam member and the magnetostrictive rod is proportional to a multiplied value of "the Young's modulus of the constituent material of each member" and "the second moment of area of the transverse cross-sectional surface of each member". Thus, in the power generator 1, it is preferable to make a multiplied value of "the Young's modulus Eh of the constituent material of the beam member 73" and "the second moment of area Ih of the transverse cross-sectional surface of the beam member 73" larger than a multiplied value of "the Young's modulus Ej of the constituent material (the magnetostrictive material) of each magnetostrictive rod 2" and "the second moment of area Ij of the transverse cross-sectional surface of each magnetostrictive rod 2". Namely, in the power generator 1, it is preferable that the beam member 73 and the magnetostrictive rods 2 are configured to satisfy the relationship of "Eh×Ih>Ej×Ij". With this configuration, it is possible to make the elastic energy caused by the bending deformation and stored in the beam member 73 larger than the elastic energy caused by the bending deformation and stored in each of the magnetostrictive rods 2, thereby more improving the power generation efficiency of the power generator 1.

On the other hand, the elastic energy Uh, Uj caused by the deformation in the expanding and contracting direction and respectively stored in the beam member and the magnetostrictive rod can be respectively expressed by the following formulas (2-9) and (2-10).

$$Uh = \tfrac{1}{2} \times Fh \times \Delta Lh \tag{2-9}$$

$$Uj = \tfrac{1}{2} \times Fj \times \Delta Lj \tag{2-10}$$

Further, ΔLh and ΔLj satisfy a relationship represented by the following formula (2-11) using the spring constants Kh, Kj in the expanding and contracting direction of the beam member and the magnetostrictive rod.

$$\Delta Lh = Fh / Kh,\ \Delta Lj = Fj / Kj \tag{2-11}$$

Thus, it can be found from the above formulas (2-9) to (2-11) that the elastic energy Uh, Uj satisfies relationships represented by the following formulas (2-12) and (2-13).

$$Uh = \tfrac{1}{2} \times Fh^2 / Kh \tag{2-12}$$

$$Uj = \tfrac{1}{2} \times Fj^2 / Kj \tag{2-13}$$

Here, the force applied to the beam member in the expanding and contracting direction due to the displacement of the movable portion is substantially equal to the force applied to the magnetostrictive rod in the expanding and contracting direction due to the displacement of the movable portion (Fh≈Fj). Thus, it can be found from the above formulas (2-12) and (2-13) that the elastic energy Uh, Uj satisfies a relationship represented by the following formula (2-14).

$$Uh \propto 1/Kh, \; Uj \propto 1/Kj \quad (2\text{-}14)$$

The spring constants Kh, Kj in the expanding and contracting direction can be respectively expressed by the following formulas (2-15) and (2-16).

$$Kh = Eh \times Ah/Lh \quad (2\text{-}15)$$

$$Kj = Ej \times Aj/Lj \quad (2\text{-}16)$$

Further, since the relationship of "Lh≈Lj" is satisfied as described above, it can be found from the above formulas (2-14) to (2-16) that the elastic energy Uh, Uj satisfies a relationship represented by the following formula (2-17).

$$Uh \propto 1/(Eh \times Ah), \; Uj \propto 1/(Ej \times Aj) \quad (2\text{-}17)$$

As is clear from the above formula (2-17), the elastic energy caused by the deformation in the expanding and contracting direction and respectively stored in the beam member and the magnetostrictive rod is inversely proportional to a multiplied value of "the Young's modulus of the constituent material of each member" and "the cross-sectional area of each member". Thus, in the power generator 1, it is preferable to make a multiplied value of "the Young's modulus Eh of the constituent material of the beam member 73" and "the cross-sectional area Ah of the beam member 73" larger than a multiplied value of "the Young's modulus Ej of the constituent material (magnetostrictive material) of each magnetostrictive rod 2" and "the cross-sectional area Aj of each magnetostrictive rod 2". Namely, in the power generator 1, it is preferable that the beam member 73 and each magnetostrictive rod 2 satisfy a relationship of "Eh×Ah>Ej×Aj". With this configuration, it is possible to make the elastic energy caused by the deformation in the expanding and contracting direction and stored in each magnetostrictive rod 2 larger than the elastic energy caused by the deformation in the expanding and contracting direction and stored in the beam member 73, thereby more improving the power generation efficiency of the power generator 1.

In the case where the beam member 73 and each magnetostrictive rod 2 satisfy both of the relationship of "Eh×Ih>Ej×Ij" and the relationship of "Eh×Ah>Ej×Aj", the following effect can be provided. Namely, it is possible to make the elastic energy Umh caused by the bending deformation and stored in the beam member 73 relatively larger than the elastic energy Umj caused by the bending deformation and stored in each magnetostrictive rod 2. Further, it is also possible to make the elastic energy Uj caused by the deformation in the expanding and contracting direction and stored in each magnetostrictive rod 2 relatively larger than the elastic energy Uh caused by the deformation in the expanding and contracting direction and stored in the beam member 73. With this configuration, when the external force is applied to the second block bodies 5, the elastic energy caused by the bending deformation is mainly stored in the beam member 73 and the elastic energy caused by the deformation in the expanding and contracting direction is mainly stored in each magnetostrictive rod 2. Thus, it is possible to more improve the power generation efficiency of the power generator 1.

Further, in the power generator 1, it is preferable that a loss coefficient of the constituent material of the beam member 73 is smaller than a loss coefficient of the magnetostrictive material of each magnetostrictive rod 2. With this configuration, it is possible to make energy loss (structural damping) caused by the deformation of the beam member 73 sufficiently smaller than energy loss (structural damping) caused by the deformation of each of the magnetostrictive rods 2. As a result, the elastic energy stored in the beam member 73 can be efficiently converted into the kinetic energy for vibrating the second block bodies 5.

In the power generator 1, although the energy loss caused by the deformation of each of the magnetostrictive rods 2 is relatively large, the energy loss caused by the deformation of the beam member 73 is sufficiently small. Thus, as a whole of the power generator 1, it is possible to sufficiently reduce energy loss caused by the deformation of the pair of beams (the magnetostrictive rods 2 and the beam member 73). With this configuration, it is possible to improve the power generation efficiency of the power generator 1.

In this regard, the words of "loss coefficient" used in the specification mean an indicator for evaluating damping property of a damping material. Generally, in a member formed of a material having a large loss coefficient, large thermal energy is generated when the member is deformed and thus loss of kinetic energy is large. On the other hand, in a member formed of a material having a small loss coefficient, the generation of the thermal energy caused when the member is deformed is suppressed and thus the loss of kinetic energy is small. A concrete method for measuring the loss coefficient of each material will be described later.

The constituent material of the beam member 73 is not particularly limited to a specific kind as long as it is the weakly magnetic material or the non-magnetic material as described above, but it is preferable to use one of the following materials as the constituent material of the beam member 73 having a loss coefficient smaller than that of the magnetostrictive material. In this regard, in the case where the members (the first connecting member 71, the second connecting member 72 and the beam member 73) constituting the connecting portion 7 are integrally formed, it is preferable that an entire of the connecting portion 7 is formed of one of the following materials.

Namely, as the constituent material of the beam member 73 (the connecting portion 7), it is preferable to use a weakly magnetic material such as a stainless steel, a non-magnetic material such as aluminum, a magnesium alloy, a steel alloy and a non-magnetic stainless steel and the like. In particular, it is more preferable to use an austenite based stainless steel, which is one kind of the non-magnetic stainless steel, as the constituent material of the beam member 73 (the connecting portion 7).

Here, description will be given to a change of amplitude (damping) of vibration (vibration amplitude) with a lapse of time at a rod member depending on a difference of loss coefficients of constituent materials for the rod member with reference to FIG. 9. This vibration of the rod member is generated by applying external force to a tip end portion of the rod member in a state that a base end portion of the rod member is fixed to a housing.

Figure 9:
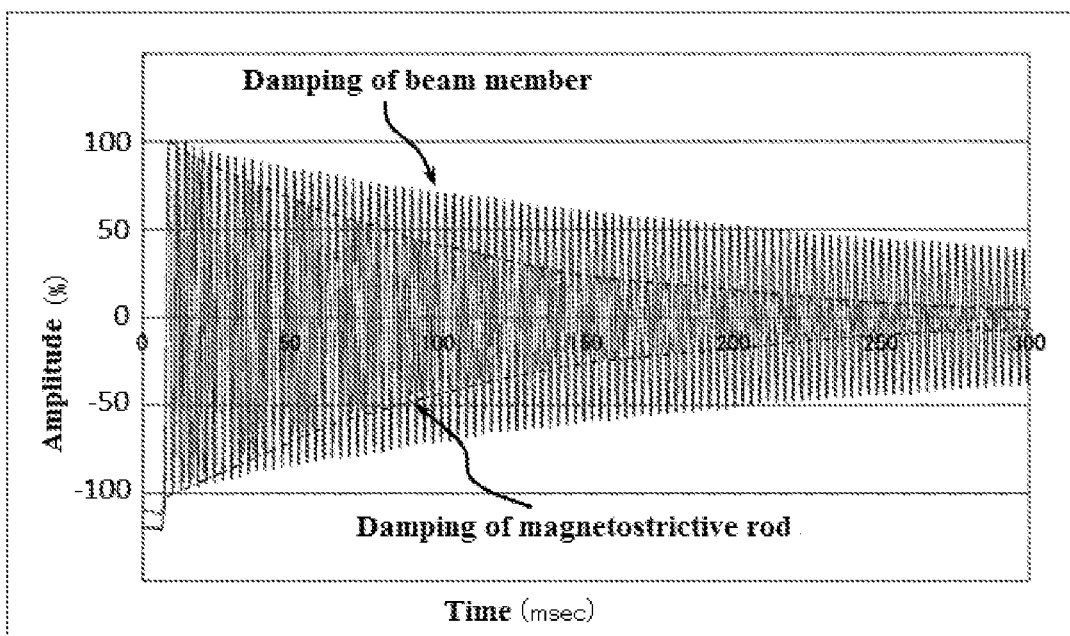
FIG. 9 is a graph showing a relationship between a change of amplitude (damping) of vibration with a lapse of time at a tip end portion of a magnetostrictive rod formed of a magnetostrictive material containing an iron-gallium based alloy as a main component thereof and a change of amplitude (damping) of vibration with a lapse of time at a tip end portion of a beam member formed of a non-magnetic stainless steel. The vibration of the magnetostrictive rod and the beam member is generated by applying external force to the tip end portions of the magnetostrictive rod and the beam member in a state that base end portions of the magnetostrictive rod and the beam member are fixed to a housing.

FIG. 9 is a graph showing a relationship between a change of amplitude (damping) of vibration with a lapse of time at a tip end portion of a magnetostrictive rod formed of a magnetostrictive material containing an iron-gallium based alloy as a main component thereof and a change of amplitude (damping) of vibration with a lapse of time at a tip end portion of a beam member formed of a non-magnetic stainless steel. The vibration of the magnetostrictive rod and the beam member is generated by applying external force to the tip end portions of the magnetostrictive rod and the beam member in a state that base end portions of the magnetostrictive rod and the beam member are fixed to a housing.

A constituent material (magnetostrictive material) of the magnetostrictive rod used for this evaluation has a loss coefficient of $9 \times 10^{-3}$ and a Young's modulus of 70 GPa and the magnetostrictive rod has a length of 25 mm and a cross-sectional area of 1.5 mm². A constituent material (the non-magnetic stainless steel) of the rod member (the beam member) used for this evaluation has a loss coefficient of $1 \times 10^{-4}$ and a Young's modulus of 200 GPa and the rod member (the beam member) has a length of 25 mm and a cross-sectional area of 1.5 mm². In FIG. 9, amplitude (initial amplitude) of the tip end portion of each rod member (the magnetostrictive rod and the rod member formed of the non-magnetic stainless steel) immediately after the tip end portion of each rod member is vibrated by applying load of 1 N to the tip end portion of each rod member in a direction perpendicular to an axial direction of each rod member is shown as 100%.

As shown in FIG. 9, damping of the amplitude of the tip end portion of the rod member (the beam member) formed of the non-magnetic stainless steel is slower than damping of the amplitude of the tip end portion of the magnetostrictive rod formed of the magnetostrictive material having the loss coefficient larger than the loss coefficient of the constituent material of the beam member. For example, time duration until the amplitude of the tip end portion of the magnetostrictive rod decays to 50% of the initial amplitude is about 82 msec. On the other hand, time duration until the amplitude of the tip end portion of the beam member decays to 50% is about 210 msec. As is clear from FIG. 9, in the beam member having the loss coefficient smaller than the loss coefficient of the magnetostrictive rod, it is possible to suppress the energy loss caused by the deformation (vibration) of the beam member.

The loss coefficient of the constituent material of the beam member 73 is preferably equal to or less than $6 \times 10^{-4}$ and more preferably in the range of about $2 \times 10^{-5}$ to $2 \times 10^{-4}$. In the case where the loss coefficient of the constituent material of the beam member 73 satisfies the above condition, it is possible to more reduce the energy loss caused by the deformation of the beam member 73. With this configuration, the elastic energy stored in the beam member 73 is more efficiently converted into the kinetic energy for vibrating the second block bodies 5, thereby more improving the power generation efficiency of the power generator 1.

When the loss coefficient of the constituent material of the beam member 73 is defined as "$\eta_1$" and the loss coefficient of the magnetostrictive material of the magnetostrictive rods 2 is defined as "$\eta_2$", a value of $\eta_1/\eta_2$ is preferably equal to or less than 0.3 and more preferably in the range of about 0.01 to 0.2. In the case where the value of $\eta_1/\eta_2$ satisfies the above condition, it is possible to more reduce the energy loss caused by the deformations of the magnetostrictive rods 2 and the beam member 73 as a whole of the power generator 1, thereby more improving the power generation efficiency of the power generator 1.

In this regard, each of the loss coefficient of the constituent material of the beam member 73 and the loss coefficient of the magnetostrictive material can be measured by a method defined in the JIS (Japanese Industrial Standard) related to a test method for vibrational damping property of a damping steel plate (JIS G0602), a method defined in the ASTM standard and using a cantilever beam (ASTM E756-83) or the like.

A magnitude relationship between the loss coefficient of the constituent material of the beam member 73 and the loss coefficient of the magnetostrictive material can be evaluated by the following method, for example. Namely, rod members respectively formed of the constituent materials of the members (the beam member 73 and the magnetostrictive rods 2) are first prepared. Then, each of the rod members is supported in a cantilevered state that a base end portion of each of the rod members serves as a fixed end portion and a tip end portion of each of the rod members serves as a movable end portion and then the movable end portion of each of the rod members is vibrated in this state. Further, this vibration of the movable end portion of each of the rod members is measured by a displacement meter or the like. With this method, it is possible to relatively evaluate a loss coefficient of each member.

Further, the Young's modulus of the constituent material of the beam member 73 as described above is preferably in the range of about 80 to 200 GPa, more preferably in the range of about 100 to 190 GPa, and even more preferably in the range of about 120 to 180 GPa.

Further, it is preferable that the transverse cross-sectional shape (cross-sectional shape in the short direction) of the beam member 73 is substantially constant along the longitudinal direction thereof. An average thickness of the beam member 73 is not particularly limited to a specific value, but is preferably in the range of about 0.3 to 10 mm, and more preferably in the range of about 0.5 to 5 mm. Further, an average cross-sectional area of the beam member 73 is preferably in the range of about 0.2 to 200 mm², and more preferably in the range of about 0.5 to 50 mm².

Further, according to the power generator 1, it is possible to freely adjust (design) a gap between each magnetostrictive rod 2 and the beam member 73 (hereinafter, this gap is referred to as "beam gap") in the side view. Specifically, by adjusting a length (height) from the slits 411, 501 formed in each block body 4, 5 to an upper surface of each block body 4, 5 (in the case of the first block body 4, an upper surface of the tall block body 41), it is possible to freely adjust the beam gap between each magnetostrictive rod 2 and the beam member 73.

As described above, according to the power generator 1, it is possible to sufficiently increase the size of each coil 3 and freely adjust the beam gap between each magnetostrictive rod 2 and the beam member 73. Hereinafter, description will be given to a relationship between the beam gap and the power generation efficiency of the power generator 1.

Figure 10:
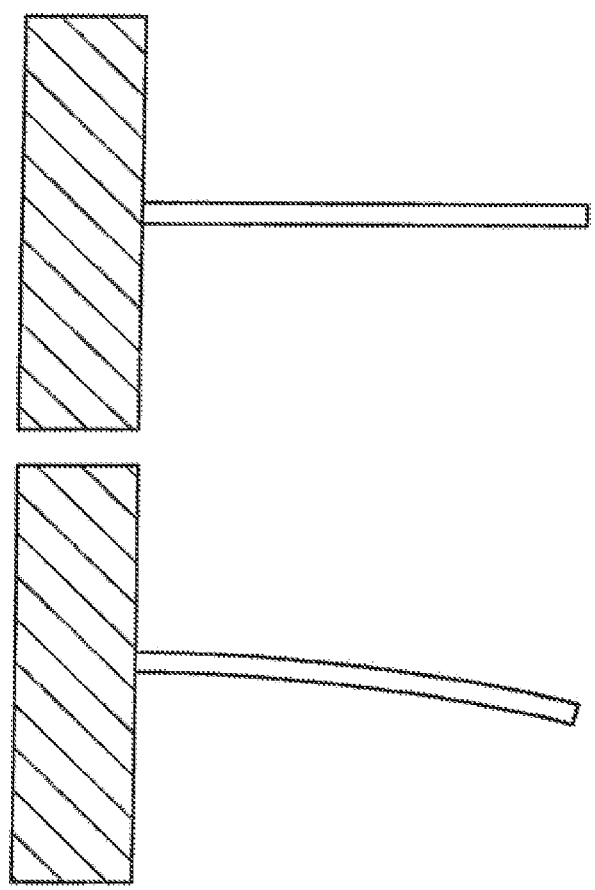
FIG. 10 is a side view schematically showing a state that external force in the lower direction is applied to a tip end portion of one rod member (one beam) whose base end portion is fixed to a housing.
Figure 11:
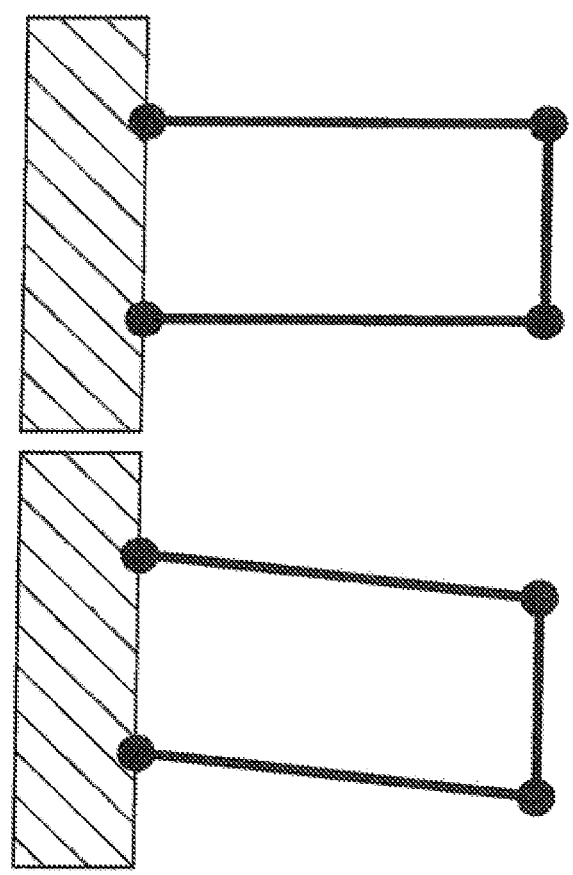
FIG. 11 is a side view schematically showing a state that external force in the lower direction is applied to tip end portions of a pair of beams (parallel beams) which are parallel arranged so as to face each other and whose base end portions are fixed to a housing.
Figure 12:
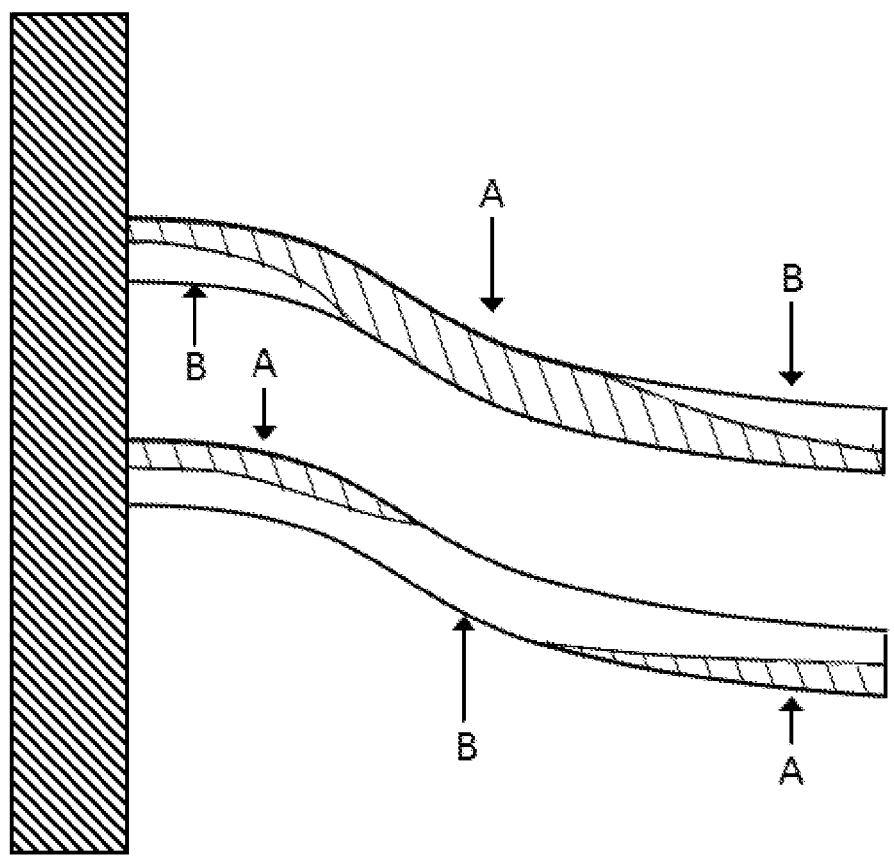
FIG. 12 is a view schematically showing stress (tensile stress and compressive stress) generated in the pair of parallel beams when external force is applied to the tip end portions of the pair of parallel beams.

FIG. 10 is a side view schematically showing a state that external force in the lower direction is applied to a tip end portion of one rod member (one beam) whose base end portion is fixed to a housing. FIG. 11 is a side view schematically showing a state that external force in the lower direction is applied to tip end portions of a pair of beams (parallel beams) which are parallel arranged so as to face each other and whose base end portions are fixed to a housing. FIG. 12 is a view schematically showing stress (tensile stress and compressive stress) generated in the pair of parallel beams when external force is applied to the tip end portions of the pair of parallel beams.

Hereinafter, an upper side in each of FIGS. 10 to 12 is referred to as "upper" or "upper side" and a lower side in each of FIGS. 10 to 12 is referred to as "lower" or "lower side". Further, a left side of each of FIGS. 10 to 12 is referred to as "base end side" and a right side in each of FIGS. 10 to 12 is referred to as "tip end side".

When the external force is applied to the tip end portion of one beam so that the beam is bent and deformed in the lower direction as shown in FIG. 10, the stress is generated in the beam due to this bending deformation of the beam. At this time, uniform tensile stress (stretching stress) is generated on an upper portion of the beam and uniform compressive stress (contraction stress) is generated on a lower portion of the beam. On the other hand, when the external force is applied to the tip end portions of the parallel beams having a certain beam gap, the pair of beams are deformed with two states simultaneously occurring. One of the two states is that each beam is bent and deformed as shown in FIG. 10. The other one of the two states is that the pair of beams are deformed as shown in FIG. 11 so as to perform a parallel link movement for keeping the beam gap on the tip end side constant before and after the external force is applied. In the parallel beams described above, this parallel link operation becomes marked as the beam gap increases. On the other hand, the parallel link operation is suppressed as the beam gap decreases. Thus, the deformations of the parallel beams become similar to the bending deformation of the one beam as shown in FIG. 10 as the beam gap decreases.

Thus, the bending deformation and the deformation due to the parallel link movement simultaneously occur in the configuration of the parallel beams having a relatively large beam gap. As a result, each beam is deformed in a substantially S-like shape as shown in FIG. 12. When the parallel beams are deformed in the lower direction, it is preferable that uniform tensile stress is generated in the upper beam. Actually, as shown in FIG. 12, although tensile stress A is generated in a central portion of the upper beam, large compressive stress B is generated in a lower portion of the upper beam on the base end side and an upper portion of the upper beam on the tip end side. Further, it is preferable that uniform compressive stress is generated in the lower beam. Actually, although the compressive stress B is generated in a central portion of the lower beam, the large tensile stress A is generated in an upper portion of the lower beam on the base end side and a lower portion of the lower beam on the tip end side. Namely, since both of the tensile stress A and the compressive stress B generated in each beam are large, it is impossible to increase an absolute value of one of the tensile stress and the compressive stress generated in an entire of the beam. Thus, in the case of using the described parallel beams as the magnetostrictive rods, it is impossible to increase the variation amount of the magnetic flux density in each of the magnetostrictive rods.

In this regard, there is the following relationship between the variation amount of the magnetic flux density and magnitude of the stress (the tensile stress or the compressive stress) generated in the magnetostrictive rod to which the bias magnetic field is applied.

Figure 13:
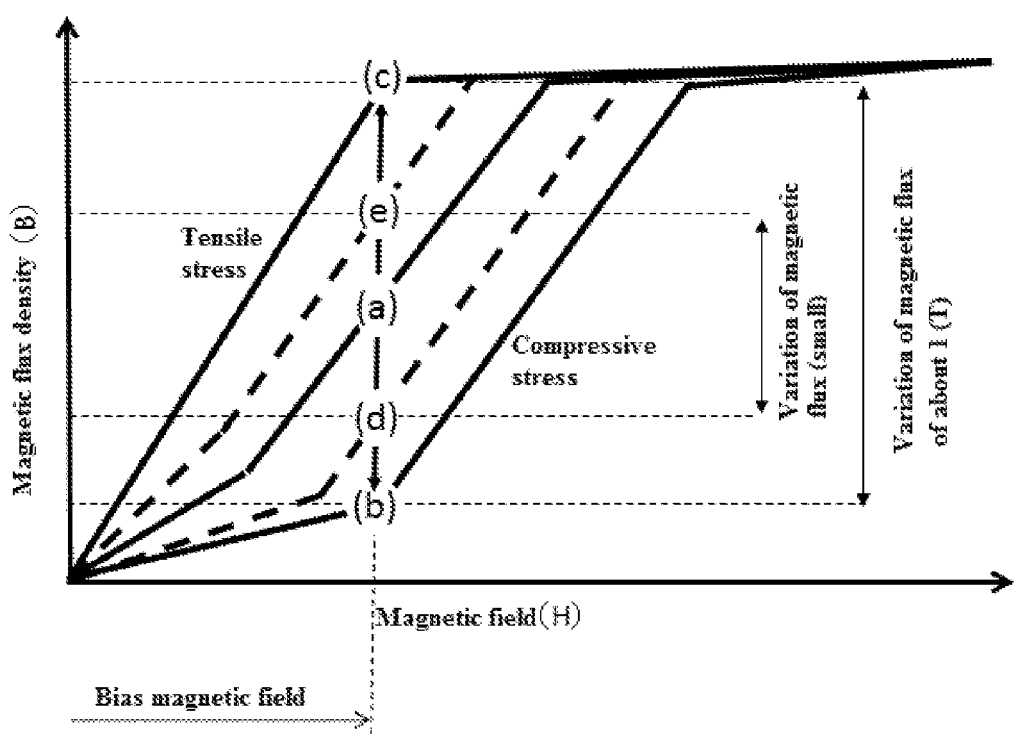
FIG. 13 is a graph showing a relationship between a magnetic field (H) applied to a magnetostrictive rod and magnetic flux density (B) of the magnetostrictive rod depending on stress generated in the magnetostrictive rod. The magnetostrictive rod used in this graph is formed of the magnetostrictive material containing the iron-gallium based alloy as the main component thereof.

FIG. 13 is a graph showing the relationship between the magnetic field (H) applied to the magnetostrictive rod and the magnetic flux density (B) of the magnetostrictive rod depending on the stress generated in the magnetostrictive rod. The magnetostrictive rod used in this graph is formed of the magnetostrictive material containing the iron-gallium based alloy (having the Young's modulus of about 70 GPa) as the main component thereof.

In FIG. 13, "(a)" represents a state that stress is not generated in the magnetostrictive rod, "(b)" represents a state that compressive stress of 90 MPa is generated in the magnetostrictive rod, "(c)" represents a state that tensile stress of 90 MPa is generated in the magnetostrictive rod, "(d)" represents a state that compressive stress of 50 MPa is generated in the magnetostrictive rod and "(e)" represents a state that tensile stress of 50 MPa is generated in the magnetostrictive rod.

Magnetic permeability of the magnetostrictive rod in which the tensile stress is generated is higher than magnetic permeability of the magnetostrictive rod in which the stress is not generated. As a result, the density of the lines of magnetic force (the magnetic flux density) passing through the magnetostrictive rod, in which the tensile stress is generated, in the axial direction thereof becomes higher as shown in FIG. 13 (the cases of "(c)" and "(e)"). On the other hand, magnetic permeability of the magnetostrictive rod in which the compressive stress is generated is lower than the magnetic permeability of the magnetostrictive rod in which the stress is not generated. As a result, the magnetic flux density passing through the magnetostrictive rod, in which the compressive stress is generated, in the axial direction thereof becomes lower (the cases of "(b)" and "(d)").

Thus, when the other end portion of the magnetostrictive rod is vibrated (displaced) with respect to the one end portion thereof in a state that a certain bias magnetic field shown in FIG. 13 is applied to the magnetostrictive rod to alternately generate the tensile stress of 90 MPa and the compressive stress of 90 MPa in the magnetostrictive, the variation amount of the magnetic flux density passing through the magnetostrictive rod becomes a maximum of about 1 T (see the cases of "(b)" and "(c)"). On the other hand, when the tensile stress and the compressive stress generated in the magnetostrictive rod are decreased to 50 MPa, the variation amount of the magnetic flux density passing through the magnetostrictive rod also decreases (see the cases of "(d)" and "(e)").

Thus, in order to increase the variation amount of the magnetic flux density passing through the magnetostrictive rod, it is necessary to sufficiently increase the tensile stress or the compressive stress (the stress in a constant direction) generated in the magnetostrictive rod. In this regard, in the case of using the magnetostrictive rod formed of the above-mentioned magnetostrictive material, by alternately generating tensile stress of 70 MPa or more and compressive stress of 70 MPa or more in the magnetostrictive rod, it is possible to sufficiently increase the variation amount of the magnetic flux density passing through the magnetostrictive rod.

From the above results of study, the following fact has been found. Namely, from a point of view of improving the power generation efficiency, it is preferable that the power generator 1 whose magnetostrictive rods and beam member constitute the pair of parallel beams are configured so that a behavior of a bending deformation of the pair of parallel beams becomes similar to a behavior of the bending deformation of one beam as shown in FIG. 10 by decreasing the beam gap between each magnetostrictive rod 2 and the beam member 73 to suppress the parallel link movement of the beams. In the power generator 1, since the size of each coil 3 is not restricted by the beam gap between each magnetostrictive rod 2 and the beam member 73, it is possible to sufficiently increase the size of each coil 3 and design the power generator 1 so as to make the beam gap between each magnetostrictive rod 2 and the beam member 73 sufficiently small. With this configuration, it is possible to increase the size of each coil 3 and uniform the stress generated in each magnetostrictive rod 2, thereby more improving the power generation efficiency of the power generator 1.

In this regard, the switching device for which the power generator 1 is used is not particularly limited to a specific type. For example, the switching device can function without being wired for a power supply (external power supply) and a signal line and can be used for a wireless switch for house lighting, a home security system (in particular, a system for wirelessly informing detection of operation of a window or a door) or the like.

Further, by applying the power generator 1 to each switch of a vehicle, it becomes unnecessary to wire the switch for the power supply and the signal line. With such a configuration, it is possible to reduce the number of assembling steps and a weight of a wire provided in the vehicle, thereby achieving weight saving of the vehicle or the like. This makes it possible to suppress a load on a tire, a vehicle body and an engine and contribute to safety of the vehicle.

Further, in addition to the intended use of the switching device, the power generator 1 can be used in a state that the power generator 1 is fixedly attached to a housing of a vibrating body such as a pump and an air-conditioning duct. Specifically, the power generator 1 can be used by fixing the first block bodies 4 to the housing of the vibrating body and applying external force or vibration caused from vibration of the vibrating body to the second block bodies 5 in the vertical direction.

In this regard, the vibrating body to which the power generator 1 is attached is, for example, a duct or a pipe used for forming a flow channel in a device for delivering (discharging, ventilating, inspiring, wasting or circulating) steam, water, fuel oil and gas (such as air and fuel gas). Examples of the pipe and the duct include a pipe and an air-conditioning duct installed in a big facility, building, station and the like. Further, the vibrating body to which the power generator 1 is attached is not limited to such a pipe and an air-conditioning duct. Examples of the vibrating body include a transportation (such as a freight train, an automobile and a back of truck), a crosstie (skid) for railroad, a wall panel of an express highway or a tunnel, a bridge, a vibrating device such as a pump and a turbine.

The vibration of the vibrating body is unwanted vibration for delivering an objective medium (in the case of the air-conditioning duct, gas and the like passing through the duct). The vibration of the vibrating body normally results in noise and uncomfortable vibration. In the present invention, by fixedly attaching the power generator 1 to such a vibrating body, it is possible to generate electric energy in the power generator 1 by converting (regenerating) such unwanted vibration (kinetic energy).

The power generator 1 can be utilized for a power supply of a sensor, a wireless communication device and the like. For example, the power generator 1 can be utilized in a system containing a sensor and a wireless communication device. In this system, by utilizing the electric energy (electric power) generated by the power generator 1 to drive the sensor, the sensor can get measured data such as illumination intensity, temperature, humidity, pressure and noise in a facility or a residential space. Further, by utilizing the electric power generated by the power generator 1 to drive the wireless communication device, the wireless communication device can transmit the data measured by the sensor to an external device (such as a server and a host computer) as detected data. The external device can use the measured data as various control signals or a monitoring signal. Furthermore, the power generator 1 can be used for a system for monitoring status of each component of vehicle (for example, a tire pressure sensor and a sensor for seat belt wearing detection). Further, by converting such unwanted vibration of the vibrating body to the electric energy with the power generator 1, it is possible to provide an effect of reducing the noise and the uncomfortable vibration generated from the vibrating body.

The power generation amount of the power generator 1 is not particularly limited to a specific value, but is preferably in the range of about 20 to 2000 μJ. If the power generation amount of the power generator 1 (power generating capability of the power generator 1) is in the above range, it is possible to efficiently utilize the electric power generated by the power generator 1 for the wireless switch for house lighting, the home security system or the like described above in combination with a wireless communication device.

Although the beam member 73 and the coils 3 respectively wound around the magnetostrictive rods 2 are arranged so as not to overlap with each other in the planar view in the power generator 1 according to this embodiment, it may be possible to take a configuration in which parts of the coils 3 overlap with the beam member 73 in the planar view. Specifically, it may be possible to take a configuration in which the magnetostrictive rods 2 and the beam member 73 do not overlap with each other in the planar view and end portions of the coils 3 and the end portions of the beam member 73 overlap with each other in the planar view. Even in the case of taking such a configuration, it is possible to sufficiently ensure the winding spaces for the coils 3 and sufficiently decrease the beam gap between each magnetostrictive rod 2 and the beam member 73 within a range that the coils 3 and the beam member 73 do not make contact with each other, thereby providing the same effect as the effect provided by the above power generator 1.

Further, the power generator 1 of this embodiment includes the two magnetostrictive rods 2 and the one beam member 73 as the beams facing each other. However, the power generator 1 of this embodiment is not limited thereto and it is possible to take the following configuration.

For example, it may be possible to take a configuration in which the connecting portion includes two beam members for respectively connecting the end portions of the first connecting member in the longitudinal direction thereof and the end portions of the second connecting member in the longitudinal direction thereof. In this configuration, since the beam members are arranged on the outer side of the magnetostrictive rods, it is possible to increase the size of each coil and decrease the gap between the magnetostrictive rods, thereby reducing a size of the power generator 1 in the width direction thereof. Even in the case of taking this configuration, it is possible to provide the same effect as the effect provided by the power generator 1 of the described embodiment.

Further, the power generator 1 can take a configuration including two or more of the magnetostrictive rods 2 and one or more of the beam members 73. In the case of changing a total number of the magnetostrictive rods 2 and the beam members 73, it is preferable that this total number is an odd number. Specifically, the power generator 1 can take a configuration in which a ratio of the number of the magnetostrictive rods 2 and the number of the beam members 73 (the number of the magnetostrictive rods 2:the number of the beam members 73) becomes 2:3, 3:2, 3:4, 4:3, 4:5 or the like. In such a configuration, since the magnetostrictive rods 2 and the beam members 73 serving as the beams are symmetrically arranged in the width direction of the power generator 1, it is possible to achieve a good balance among the stress generated in the magnetostrictive rods 2, each block body 4, 5 and the connecting portion 7.

In the case of taking the configuration as described above, when the spring constant of each of the beam members 73 is defined as "A" [N/m], the number of the beam members 73 is defined as "X", the spring constant of each of the magnetostrictive rods 2 is defined as "B" [N/m] and the number of the magnetostrictive rods 2 is defined as "Y", it is preferable that the power generator 1 is configured so that a value of "A×X" is substantially equal to a value of "B×Y". With this configuration, it is possible to smoothly and reliably displace the second block bodies 5 with respect to the first block bodies 4 in the vertical direction.

In the above description, the fixing of the both end portions 21, 22 of the magnetostrictive rods 2 to each block body 4, 5 and the connection of the connecting portion 7 to each block body 4, 5 are achieved by respectively screwing the male screws 43, 53 with the female screw portions 412, 501, but the fixing and connecting method for each component is not limited to this screwing method. Examples of the fixing and connecting method for each component include a welding method (such as a laser welding method and an electric welding method), a pin pressure fitting method and a bonding method with an adhesive agent.

Second Embodiment

Next, description will be given to a second embodiment of the power generator of the present invention.

Figure 14:
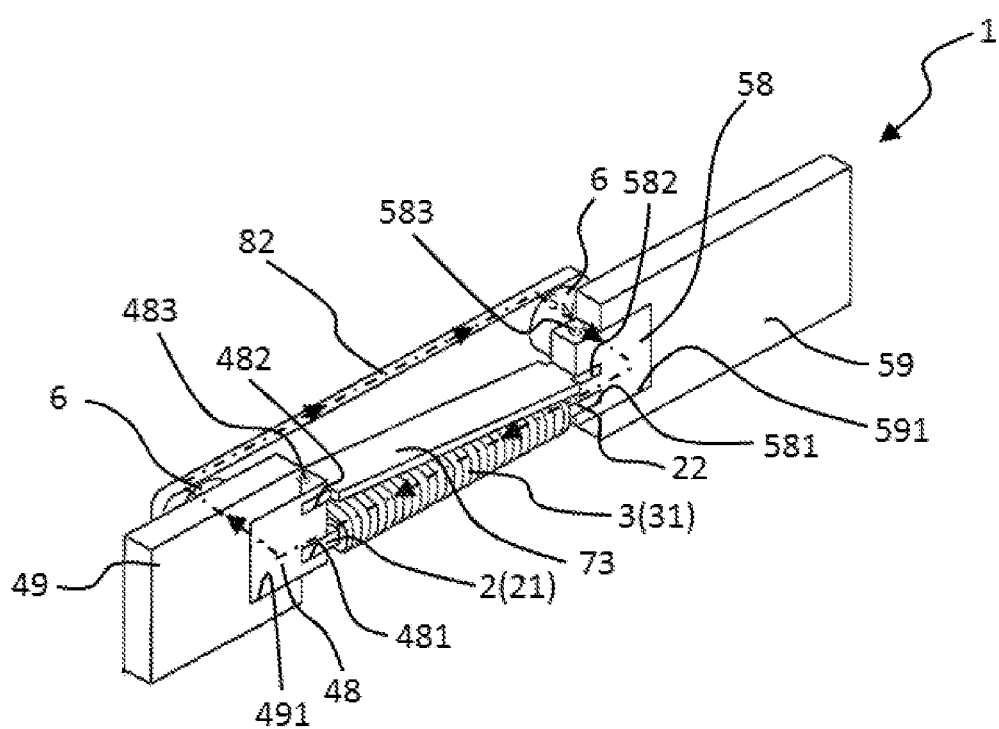
FIG. 14 is a perspective view showing a second embodiment of the power generator of the present invention.

FIG. 14 is a perspective view showing the second embodiment of the power generator of the present invention.

Hereinafter, an upper side in FIG. 14 is referred to as "upper" or "upper side" and a lower side in FIG. 14 is referred to as "lower" or "lower side". Further, a right and rear side of the paper in FIG. 14 is referred to as "tip end side" and a left and front side of the paper in FIG. 14 is referred to as "base end side".

Hereinafter, the power generator according to the second embodiment will be described by placing emphasis on the points differing from the power generator according to the first embodiment, with the same matters being omitted from the description.

The power generator 1 shown in FIG. 14 includes the magnetostrictive rod 2, the coil 3 wound around the magnetostrictive rod 2, the beam member 73, a connecting yoke 48 for connecting the base end portions of the magnetostrictive rod 2 and the beam member 73 with each other, a connecting yoke 58 for connecting the tip end portions of the magnetostrictive rod 2 and the beam member with each other, a yoke 82 arranged along the magnetostrictive rod 2 and the beam member 73 and the two permanent magnets 6 respectively arranged between the connecting yoke 48 and the yoke 82 and between the connecting yoke 58 and the yoke 82. Further, the connecting yoke 48 provided on the base end side is fixed to a supporting portion 49 and the connecting yoke 58 provided on the tip end side is fixed to a weight portion (mass portion) 59.

Further, the power generator 1 of this embodiment is configured so that the magnetostrictive rod 2 and the beam member 73 are arranged side by side in the thickness direction and the beam gap between the magnetostrictive rod 2 and the beam member 73 decreases from the base end side to the tip end side as is the case for the power generator 1 of the first embodiment.

In this regard, the magnetostrictive rod 2, the coil 3 and the beam member 73 used in this embodiment may be the same as the magnetostrictive rod 2, the coil 3 and the beam member 73 used in the first embodiment.

The connecting yoke 48 connects the base end portion 21 of the magnetostrictive rod 2 and the base end portion of the beam member 73.

Upper and lower slits 481, 482 are formed on the connecting yoke 48. The magnetostrictive rod 2 and the beam member 73 are fixed to the connecting yoke 48 with a pin 483 in a state that the base end portion 21 of the magnetostrictive rod 2 is inserted into the lower slit 481 and the base end portion of the beam member 73 is inserted into the upper slit 482.

The connecting yoke 48 is fixed to the supporting portion 49 on the base end side of the connecting yoke 48.

The supporting portion 49 has a plate-like shape. A groove portion 491 is formed in a substantially central portion of the supporting portion 49 on the tip end side thereof so as to pass through the supporting portion 49 in a width direction thereof. The connecting yoke 48 is inserted into this groove portion 491 to fix the connecting yoke 48 to the supporting portion 49.

In the power generator 1 of this embodiment, when a base end portion of the supporting portion 49 is fixed to the housing 100, the magnetostrictive rod 2 is supported in the cantilevered state that the base end portion 21 of the magnetostrictive rod 2 serves as the fixed end portion and the tip end portion 22 of the magnetostrictive rod 2 serves as the movable end portion.

The connecting yoke 58 connects the tip end portion 22 of the magnetostrictive rod 2 and the tip end portion of the beam member 73.

Upper and lower slits 581, 582 are formed on the connecting yoke 58. The magnetostrictive rod 2 and the beam member 73 are fixed to the connecting yoke 58 with a pin 583 in a state that the tip end portion 22 of the magnetostrictive rod 2 is inserted into the lower slit 581 and the tip end portion of the beam member 73 is inserted into the upper slit 582. A separation distance between the slits 581, 582 of the connecting yoke 58 is shorter than a separation distance between the slits 481, 482 of the connecting yoke 48. With this configuration, the beam gap between the magnetostrictive rod 2 and the beam member 73 decreases from the base end side to the tip end side.

This connecting yoke 58 is fixed to the weight portion 59 on the tip end side of the connecting yoke 58.

The weight portion 59 has a plate-like shape. A groove portion 591 is formed in a substantially central portion of the weight portion 59 on the base end side thereof so as to pass through the weight portion 59 in a width direction thereof. The connecting yoke 58 is inserted into this groove portion 591 to fix the weight portion 59 to the connecting yoke 58.

The weight portion 59 and the connecting yoke serve as a weight for applying external force or vibration to the magnetostrictive rod 2. When external force in the vertical direction is applied to the second block body 5, the second block body 5 is displaced in the lower direction. When the external force applied to the second block body 5 is then released, the second block body 5 is vibrated in the vertical direction. At this time, the tip end portion 22 of the magnetostrictive rod 2 begins reciprocating motion in the vertical direction in the cantilevered state that the base end portion 21 of the magnetostrictive rod 2 serves as the fixed end portions and the tip end portion 22 of the magnetostrictive rod 2 serves as the movable end portions. Namely, the tip end portion 22 of the magnetostrictive rod 2 is relatively displaced with respect to the base end portion 21 of the magnetostrictive rod 2.

A constituent material for each connecting yoke 48, 58, the supporting portion 49 and the weight portion 59 may be the same material as the above-mentioned various materials to be used for forming the first block bodies 4 and the second block bodies 5 in the first embodiment.

The yoke 82 has an elongated plate-like shape. The yoke 82 is arranged along the magnetostrictive rod 2 and the beam member 73 in the width direction thereof. A constituent material for the yoke 82 may be the same material as the above-mentioned various materials to be used for forming the first block bodies 4 and the second block bodies 5 in the first embodiment.

Each of the permanent magnets 6 has a columnar shape as is the case for each of the permanent magnets 6 of the power generator 1 of the first embodiment. A constituent material for the permanent magnets 6 may be the same as the constituent material for the permanent magnets 6 in the first embodiment.

In this embodiment, as shown in FIG. 14, the permanent magnet 6 arranged between the connecting yoke 48 and the yoke 82 is arranged so that its south pole is directed toward the side of the connecting yoke 48 and its north pole is directed toward the side of the yoke 82. On the other hand, the permanent magnet 6 arranged between the connecting yoke 58 and the yoke 82 is arranged so that its south pole is directed toward the side of the yoke 82 and its north pole is directed toward the side of the connecting yoke 58. With this configuration, it is possible to form a magnetic field loop circulating in the clockwise direction in the power generator 1.

As is the case for the power generator 1 of the first embodiment, the power generator 1 of this embodiment is configured so that the elastic energy stored in the beam member 73 is larger than the elastic energy stored in the magnetostrictive rod 2 when the external force is applied to the second block body 5 for displacing the tip end portions of the magnetostrictive rod 2 and the beam member with respect to the base end portions of the magnetostrictive rod 2 and the beam member 73 to deform the magnetostrictive rod 2 and the beam member 73. With this configuration, it is possible to make the kinetic energy of the beam member 73 larger than the kinetic energy of the magnetostrictive rod 2 when the elastic energy stored in each of the magnetostrictive rod 2 and the beam member 73 is converted into the kinetic energy. With this configuration, the magnetostrictive rod 2 can be efficiently deformed by the beam member 73, thereby improving the power generation efficiency of the power generator 1.

Further, the power generator 1 of this embodiment is configured so that the beam gap between the magnetostrictive rod 2 and the beam member 73 decreases from the base end side to the tip end side in the side view. In other words, the magnetostrictive rod 2 and the beam member 73 form a beam structure (tapered beam structure) tapering from the base end side to the tip end side (see FIG. 14). In such a structure, stiffness of the pair of beams constituted of the magnetostrictive rod 2 and the beam member 73 in the displacement direction (the vertical direction) thereof decreases from the base end side to the tip end side. Thus, when the external force is applied to the weight portion 59, the magnetostrictive rod 2 and the beam member 73 can be smoothly displaced in the displacement direction (the vertical direction). As a result, it is possible to reduce variation in the stress generated in the magnetostrictive rod 2 in the thickness direction thereof. With this configuration, it is possible to generate uniform stress in the magnetostrictive rod, thereby more improving the power generation efficiency of the power generator 1.

In this regard, an angle formed by the beam member 73 and the magnetostrictive rod 2 (taper angle) in the side view is not particularly limited to a specific value, but is preferably in the range of about 0.5 to 10°, and more preferably in the range of about 1 to 7°. If the angle formed by the beam member 73 and the magnetostrictive rod 2 is in the above range, it is possible to form the above tapered beam structure with the magnetostrictive rod 2 and the beam member 73 and sufficiently decrease the beam gap between the magnetostrictive rod 2 and the beam member 73 on the base end side. With this configuration, it is possible to generate more uniform stress in the magnetostrictive rod 2.

In this embodiment, it is possible to take a configuration in which the coil 3 is wound around the yoke instead of winding the coil 3 around the magnetostrictive rod 2. When the magnetic flux density in the magnetostrictive rod 2 varies, the magnetic flux density passing through the yoke 82 also varies. Thus, it is possible to generate the voltage in the coil 3 as is the case for the power generator 1 having the above configuration. Further, in such a configuration, it is possible to increase the gaps between the magnetostrictive rod 2 and the yoke 82 and between the beam member 73 and the yoke 82 to increase the size of the coil 3 by increasing the width of each connecting yoke 48, 58 or the thickness of each permanent magnet 6. By increasing the size of the coil 3 as described above, it is possible to more improve the power generation efficiency of the power generator 1.

In this regard, for fixing and connecting each component, it is possible to use a screwing method, a pin pressure fitting method, a welding method, a bonding method with an adhesive agent or the like.

The power generator 1 according to this second embodiment can also provide the same function and effect as the function and effect of the power generator 1 according to the first embodiment.

Although the power generator of the present invention has been described with reference to the preferred embodiments shown in the accompanying drawings, the present invention is not limited thereto. In the power generator, the configuration of each component may be possibly replaced with other arbitrary configurations having equivalent functions. It may be also possible to add other optional components to the present invention.

For example, it may be also possible to combine the configurations according to the first embodiment and the second embodiment of the present invention in an appropriate manner.

Further, it is possible to omit one of the two permanent magnets or replace one or both of the permanent magnets with an electromagnet. Furthermore, it is possible to take a configuration in which both of the permanent magnets are omitted and the power generator generates the electric power with utilizing an external magnetic field.

Further, although each of the magnetostrictive rods and the beam member has the rectangular cross-sectional shape in each of the embodiments, the present invention is not limited thereto. Examples of the cross-sectional shape of each of the magnetostrictive rods and the beam member include a circular shape, an ellipse shape and a polygonal shape such as a triangular shape, a square shape and a hexagonal.

Further, although the permanent magnet in each of the embodiments has the columnar shape, the present invention is not limited thereto. Examples of the shape of the permanent magnet include a plate-like shape, a square columnar shape and a triangle pole shape.

INDUSTRIAL APPLICABILITY

According to the present invention, it is possible to make the elastic energy stored in the beam member larger than the elastic energy stored in the magnetostrictive rod when the external force is applied to the beam for displacing the other end portion of the beam with respect to the one end portion of the beam to bend and deform the magnetostrictive rod and the beam member. When the external force applied to the beam is released in this state, the elastic energy respectively stored in the magnetostrictive rod and the beam member is converted into the kinetic energy for vibrating the other end portion of the beam (the power generator). In the power generator of the present invention, since the elastic energy caused by the bending deformation and stored in the beam member when the external force is applied is large, it is also possible to make the kinetic energy for vibrating the other end portion of the beam larger. Further, since this vibration of the other end portion of the beam allows the kinetic energy to be efficiently consumed for deforming the magnetostrictive rod (in the expanding or contracting direction), it is possible to improve the power generation efficiency of the power generator. For the reasons stated above, the present invention is industrially applicable.

What is claimed is:

1. A power generator, comprising:
a beam including at least one magnetostrictive rod formed of a magnetostrictive material and through which lines of magnetic force pass in an axial direction thereof, a first block body connected to a base end portion of the at least one magnetostrictive rod, a second block body connected to a tip end portion of the at least one magnetostrictive rod and a beam member connecting the first block body and the second block body arranged so as to face the at least one magnetostrictive rod and having a function of generating stress in the magnetostrictive rod; and
a coil wound around the magnetostrictive rod so that the lines of magnetic force pass inside the coil in an axial direction of the coil whereby a voltage is generated in the coil due to variation of density of the lines of magnetic force,
wherein the beam has one end portion and the other end portion,
wherein the other end portion of the beam can be displaced with respect to the one end portion of the beam, and
wherein the power generator is configured so that elastic energy stored in the beam member is larger than elastic energy stored in the magnetostrictive rod when the other end portion of the beam is displaced to deform the magnetostrictive rod and the beam member.

2. The power generator as claimed in claim 1, wherein each of the magnetostrictive rod and the beam member has a substantially constant cross-sectional shape in a short direction thereof, and
when a Young's modulus of a constituent material of the beam member is defined as "Eh" [$N/m^2$], a second moment of area of a cross-sectional surface of the beam member in the short direction thereof is defined as "Ih" [$m^4$], a Young's module of the magnetostrictive material is defined as "Ej" [$N/m^2$] and a second moment of area of a cross-sectional surface of the magnetostrictive rod in the short direction thereof is defined as "Ij" [$m^4$], "Eh", "Ih", "Ej" and "Ij" satisfy a relationship of "Eh×Ih>Ej×Ij".

3. The power generator as claimed in claim 2, wherein when a cross-sectional area of the beam member in the short direction thereof is defined as "Ah" [$m^2$] and a cross-sectional area of the magnetostrictive rod in the short direction thereof is defined as "Aj" [$m^2$], the magnetostrictive rod and the beam member satisfy a relationship of "Eh×Ah>Ej×Aj".

4. The power generator as claimed in claim 1, wherein a loss coefficient of a constituent material of the beam member is smaller than a loss coefficient of the magnetostrictive material.

5. The power generator as claimed in claim 1, wherein when a loss coefficient of a constituent material of the beam member is defined as "$\eta_1$" and a loss coefficient of the magnetostrictive material is defined as "$\eta_2$", a value of $\eta_1/\eta_2$ is equal to or less than 0.3.

6. The power generator as claimed in claim 1, wherein the magnetostrictive rod and the beam member are arranged so as not to overlap with each other in a side view.

7. The power generator as claimed in claim 1, wherein a gap between the magnetostrictive rod and the beam member in a side view decreases from the side of the one end portion of the beam to the side of the other end portion of the beam.

8. The power generator as claimed in claim 1, wherein the at least one magnetostrictive rod includes two or more of the magnetostrictive rods arranged side by side, and
each of the magnetostrictive rods and the beam member are arranged so as not to overlap with each other in a planar view.

9. The power generator as claimed in claim 8, wherein the beam member is arranged between the magnetostrictive rods in the planar view.

10. The power generator as claimed in claim 8, wherein the coil includes coils respectively wound around the magnetostrictive rods, and
each of the coils and the beam member are arranged so as not to overlap with each other in the planar view.

* * * * *